(12) United States Patent
Karamoto et al.

(10) Patent No.: US 12,543,357 B2
(45) Date of Patent: Feb. 3, 2026

(54) SEMICONDUCTOR DEVICE

(71) Applicant: FUJI ELECTRIC CO., LTD., Kawasaki (JP)

(72) Inventors: Yuki Karamoto, Matsumoto (JP); Kaname Mitsuzuka, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 340 days.

(21) Appl. No.: 18/172,348

(22) Filed: Feb. 22, 2023

(65) Prior Publication Data

US 2023/0299145 A1 Sep. 21, 2023

(30) Foreign Application Priority Data

Mar. 16, 2022 (JP) .................................. 2022-041244

(51) Int. Cl.
*H10D 62/17* (2025.01)
*H10D 12/00* (2025.01)

(52) U.S. Cl.
CPC ......... *H10D 62/393* (2025.01); *H10D 12/481* (2025.01)

(58) Field of Classification Search
CPC ........................... H10D 12/481; H10D 62/393
USPC ........................................................ 257/140
See application file for complete search history.

(56) References Cited

U.S. PATENT DOCUMENTS

| | | | |
|---|---|---|---|
| 2002/0130331 A1* | 9/2002 | Nemoto | H10D 8/50 257/493 |
| 2004/0041225 A1* | 3/2004 | Nemoto | H10D 30/668 257/458 |
| 2012/0267681 A1 | 10/2012 | Nemoto | |
| 2014/0217407 A1* | 8/2014 | Mizushima | H01L 21/263 438/16 |
| 2014/0246750 A1 | 9/2014 | Takishita | |
| 2014/0246755 A1* | 9/2014 | Yoshimura | H01L 21/263 257/617 |
| 2015/0179441 A1 | 6/2015 | Onozawa | |
| 2017/0352730 A1 | 12/2017 | Nakamura | |
| 2018/0012762 A1 | 1/2018 | Mukai | |
| 2018/0130875 A1 | 5/2018 | Suzuki | |
| 2018/0182844 A1 | 6/2018 | Nakamura | |
| 2018/0366566 A1 | 12/2018 | Suzuki | |
| 2019/0027561 A1 | 1/2019 | Ohi | |
| 2020/0058506 A1 | 2/2020 | Nakamura | |
| 2020/0273970 A1 | 8/2020 | Okuda | |

(Continued)

FOREIGN PATENT DOCUMENTS

| | | |
|---|---|---|
| JP | 2018078216 A | 5/2018 |
| JP | 2018107303 A | 7/2018 |

(Continued)

*Primary Examiner* — Igwe U Anya

(57) ABSTRACT

Provided is a semiconductor device including: a semiconductor substrate having an upper surface and a lower surface and provided with a drift region of a first conductivity type; and a buffer region provided between the drift region and the lower surface and having a higher doping concentration than the drift region. The buffer region has M doping concentration peaks provided at different positions in a depth direction of the semiconductor substrate, and a charge carrier coefficient α represented by Expression (1) is 2000 or more and 50000 or less in at least one integer i (i is an integer of 1 or more and M−1 or less).

20 Claims, 12 Drawing Sheets

(56) References Cited

U.S. PATENT DOCUMENTS

| | | |
|---|---|---|
| 2021/0043739 A1 | 2/2021 | Kato |
| 2021/0273053 A1 | 9/2021 | Suzuki |
| 2022/0059680 A1 | 2/2022 | Chen |
| 2022/0059681 A1 | 2/2022 | Suzuki |
| 2022/0115522 A1 | 4/2022 | Otsuka |
| 2022/0208962 A1 | 6/2022 | Tanaka |
| 2023/0187501 A1 | 6/2023 | Tanaka |
| 2023/0268398 A1 | 8/2023 | Nakamura |

FOREIGN PATENT DOCUMENTS

| | | |
|---|---|---|
| JP | 2019009148 A | 1/2019 |
| JP | 2020027921 A | 2/2020 |
| JP | 2020107917 A | 7/2020 |
| JP | 2020182009 A | 11/2020 |
| JP | 2021093541 A | 6/2021 |
| JP | 2021141094 A | 9/2021 |
| JP | 2022035046 A | 3/2022 |
| JP | 2022035157 A | 3/2022 |
| JP | 2022062443 A | 4/2022 |
| JP | 2022103589 A | 7/2022 |
| JP | 2023088540 A | 6/2023 |
| JP | 2023122664 A | 9/2023 |
| WO | 2013089256 A1 | 6/2013 |
| WO | 2014065080 A1 | 5/2014 |
| WO | 2016120999 A1 | 8/2016 |
| WO | 2017047285 A1 | 3/2017 |
| WO | 2018074434 A1 | 4/2018 |
| WO | 2018207394 A1 | 11/2018 |
| WO | 2020100995 A1 | 5/2020 |

\* cited by examiner

SEMICONDUCTOR DEVICE

The contents of the following Japanese patent application (s) are incorporated herein by reference:
NO. 2022-041244 filed in JP on Mar. 16, 2022

BACKGROUND

1. Technical Field

The present invention relates to a semiconductor device.

2. Related Art

Conventionally, a configuration is known in which a buffer region such as a field stopper layer is provided in a semiconductor device such as an IGBT (see, for example, Patent Documents 1 and 2).
Patent Document 1: WO 2014-65080
Patent Document 2: Japanese Patent Application Publication No. 2021-93541

DESCRIPTION OF EXEMPLARY EMBODIMENTS

Figure 1:
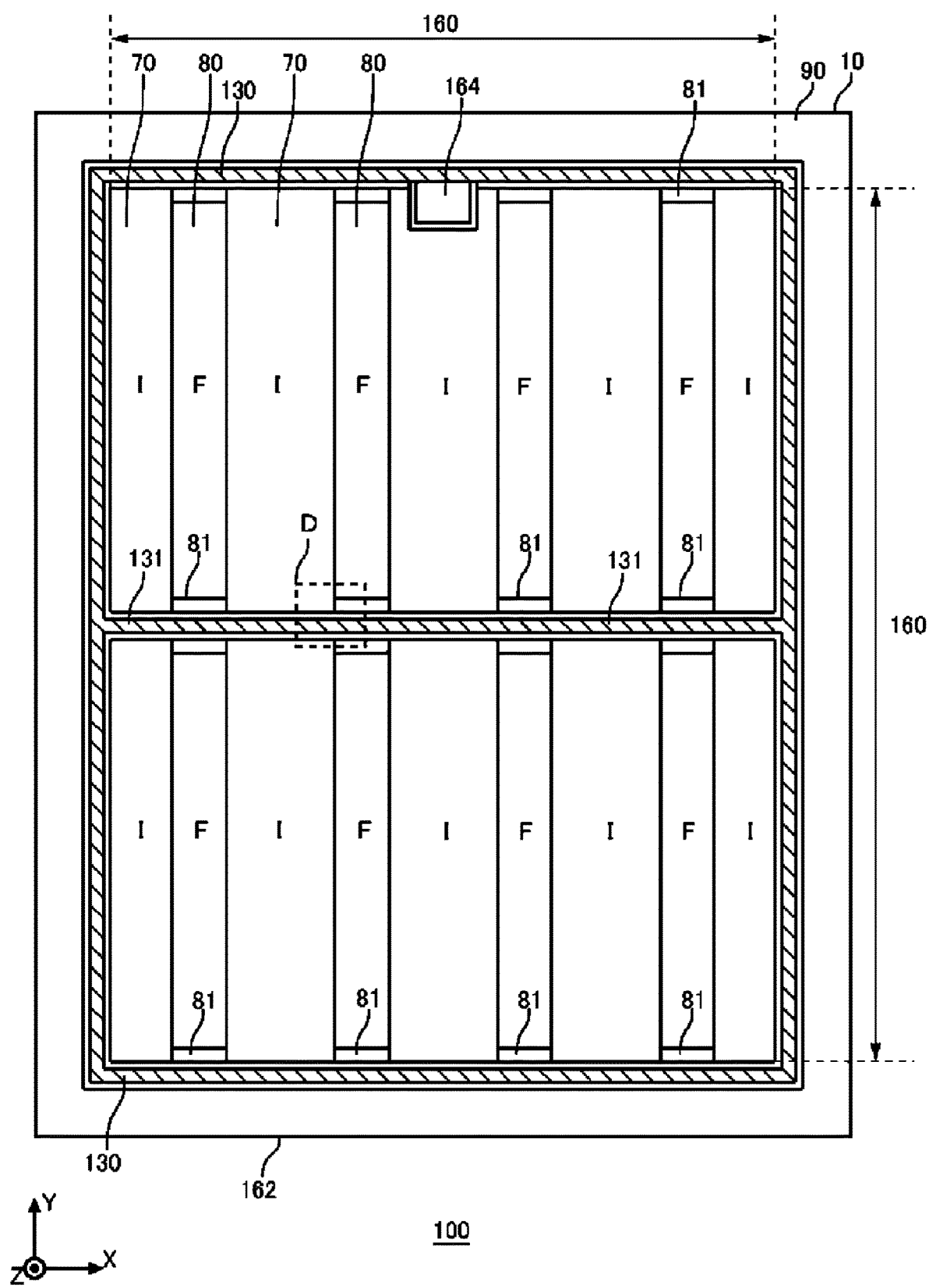
FIG. 1 is a top view illustrating an example of a semiconductor device 100 according to one embodiment of the present invention.

Hereinafter, the invention will be described through embodiments of the invention, but the following embodiments do not limit the invention according to claims. In addition, not all combinations of features described in the embodiments are essential to the solution of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are defined as the X axis and the Y axis. Further, an axis perpendicular to the upper surface and the lower surface of the semiconductor substrate is referred to as the Z axis.

In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

In addition, a region from the center of the semiconductor substrate in the depth direction to the upper surface of the semiconductor substrate may be referred to as an upper surface side. Similarly, a region from the center of the semiconductor substrate in the depth direction to the lower surface of the semiconductor substrate may be referred to as a lower surface side.

In the present specification, a case where a term such as "same" or "equal" is mentioned may include a case where an error due to a variation in manufacturing or the like is included. The error is, for example, within 10%.

In the present specification, a conductivity type of doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking into account of polarities of charges. As an example, when the donor concentration is $N_D$ and the acceptor concentration is $N_A$, the net doping concentration at any position is given as $N_D$-$N_A$. In the present specification, the net doping concentration may be simply referred to as the doping concentration.

The donor has a function of supplying electrons to a semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons. In the present specification, the VOH defect may be referred to as a hydrogen donor. The hydrogen donor may be a donor obtained by the combination of at least a vacancy (V) and hydrogen (H).

In the semiconductor substrate of the present specification, bulk donors of the N type are distributed throughout. The bulk donor is a dopant donor substantially uniformly contained in an ingot during the manufacture of the ingot from which the semiconductor substrate is made. The bulk donor of this example is an element other than hydrogen. The dopant of the bulk donor is, for example, phosphorous, antimony, arsenic, selenium, or sulfur, but the invention is not limited to these. The bulk donor of this example is phosphorous. The bulk donor is also contained in a region of the P type. The semiconductor substrate may be a wafer cut out from a semiconductor ingot, or may be a chip obtained by singulating the wafer. The semiconductor ingot may be manufactured by any one of a Czochralski method (CZ method), a magnetic field applied Czochralski method (MCZ method), or a float zone method (FZ method). The ingot in this example is manufactured by the MCZ method. An oxygen concentration contained in the substrate manufactured by the MCZ method is $1\times10^{17}$ to $7\times10^{17}/cm^3$. The oxygen concentration contained in the substrate manufactured by the FZ method is $1\times10^{15}$ to $5\times10^{16}/cm^3$. When the oxygen concentration is high, hydrogen donors tend to be easily generated. The bulk donor concentration may use a chemical concentration of bulk donors distributed throughout the semiconductor substrate, or may be a value between 90% and 100% of the chemical concentration. In addition, as the semiconductor substrate, a non-doped substrate not containing a dopant such as phosphorous may be used. In that case, the bulk donor concentration (D0) of the non-doped substrate is, for example, from $1\times10^{10}/cm^3$ or more and to $5\times10^{12}/cm^3$ or less. The bulk donor concentration (D0) of the non-doped substrate is preferably $1\times10^{11}/cm^3$ or more. The bulk donor concentration (D0) of the non-doped substrate is preferably $5\times10^{12}/cm^3$ or less. Each concentration in the present invention may be a value at room temperature. As the value at room temperature, a value at 300 K (Kelvin) (about 26.9° C.) may be used as an example.

In the present specification, a description of a P+ type or an N+ type means a higher doping concentration than that of the P type or the N type, and a description of a P− type or an N− type means a lower doping concentration than that of the P type or the N type. Further, in the present specification, a description of a P++ type or an N++ type means a higher doping concentration than that of the P+ type or the N+ type. In the present specification, a unit system is an SI base unit system unless otherwise particularly noted. Although a unit of length may be expressed in cm, calculations may be carried out after conversion to meters (m).

A chemical concentration in the present specification indicates an atomic density of an impurity measured regardless of an electrical activation state. The chemical concentration can be measured by, for example, secondary ion mass spectrometry (SIMS). The net doping concentration described above can be measured by capacitance-voltage profiling (CV profiling). Further, a carrier concentration measured by spreading resistance profiling (SRP method) may be set as the net doping concentration. The carrier concentration measured by the CV profiling or the SRP method may be a value in a thermal equilibrium state. Further, in a region of the N type, the donor concentration is sufficiently higher than the acceptor concentration, and thus the carrier concentration of the region may be set as the donor concentration. Similarly, in a region of the P type, the carrier concentration of the region may be set as the acceptor concentration. In the present specification, the doping concentration of the N type region may be referred to as the donor concentration, and the doping concentration of the P type region may be referred to as the acceptor concentration.

Further, when a concentration distribution of the donor, acceptor, or net doping has a peak in a region, a value of the peak may be set as the concentration of the donor, acceptor, or net doping in the region. In a case where the concentration of the donor, acceptor or net doping is substantially uniform in a region, or the like, an average value of the concentration of the donor, acceptor or net doping in the region may be set as the concentration of the donor, acceptor or net doping. In the present specification, $atoms/cm^3$ or $/cm^3$ is used to indicate a concentration per unit volume. This unit is used for the donor or acceptor concentration, or the chemical concentration in the semiconductor substrate. A notation of atoms may be omitted.

The carrier concentration measured by the SRP method may be lower than the concentration of the donor or the acceptor. In a range where a current flows when a spreading resistance is measured, carrier mobility of the semiconductor substrate may be lower than a value in a crystalline state. The reduction in carrier mobility occurs when carriers are scattered due to disorder (disorder) of a crystal structure due to a lattice defect or the like.

The concentration of the donor or the acceptor calculated from the carrier concentration measured by the CV profiling or the SRP method may be lower than a chemical concentration of an element indicating the donor or the acceptor. As an example, in a silicon semiconductor, a donor concentration of phosphorous or arsenic serving as a donor, or an acceptor concentration of boron (boron) serving as an acceptor is approximately 99% of chemical concentrations of these. On the other hand, in the silicon semiconductor, a donor concentration of hydrogen serving as a donor is approximately 0.1% to 10% of a chemical concentration of hydrogen.

FIG. 1 illustrates a top view showing one example of the semiconductor device 100 according to one embodiment of the present invention. FIG. 1 shows a position at which each member is projected on an upper surface of a semiconductor substrate 10. FIG. 1 shows merely some members of the semiconductor device 100, and omits illustrations of some members.

The semiconductor device 100 includes the semiconductor substrate 10. The semiconductor substrate 10 is a substrate that is formed of a semiconductor material. As an example, the semiconductor substrate 10 is a silicon substrate. The semiconductor substrate 10 has an end side 162 in the top view. When merely referred to as the top view in the present specification, it means that the semiconductor substrate 10 is viewed from an upper surface side. The semiconductor substrate 10 of this example has two sets of end sides 162 opposite to each other in the top view. In FIG. 1, the X axis and the Y axis are parallel to any of the end sides 162. In addition, the Z axis is perpendicular to the upper surface of the semiconductor substrate 10.

The semiconductor substrate 10 is provided with an active portion 160. The active portion 160 is a region where a main current flows in the depth direction between the upper surface and a lower surface of the semiconductor substrate 10 when the semiconductor device 100 operates. An emitter electrode is provided above the active portion 160, but is omitted in FIG. 1. The active portion 160 may refer to a region that overlaps with the emitter electrode in the top view. In addition, a region sandwiched by the active portion 160 in the top view may also be included in the active portion 160.

The active portion 160 is provided with at least one of a transistor portion 70 including a transistor element such as an insulated gate bipolar transistor (IGBT) and a diode portion 80 including a diode element such as a freewheeling diode (FWD). In the example of FIG. 1, the transistor portion 70 and the diode portion 80 are alternately arranged along a predetermined array direction (the X axis direction in this example) on the upper surface of the semiconductor substrate 10. The semiconductor device 100 of this example is a reverse-conducting IGBT (RC-IGBT).

In FIG. 1, a region where the transistor portion 70 is arranged is indicated by a symbol "I", and a region where the diode portion 80 is arranged is indicated by a symbol F. In the present specification, a direction perpendicular to the array direction in the top view may be referred to as an extending direction (the Y axis direction in FIG. 1). Each of the transistor portions 70 and the diode portions 80 may have a longitudinal length in the extending direction. In other words, the length of each of the transistor portions 70 in the Y axis direction is larger than the width in the X axis direction. Similarly, the length of each of the diode portions 80 in the Y axis direction is larger than the width in the X axis direction. The extending direction of the transistor portion 70 and the diode portion 80, and the longitudinal direction of each trench portion described later may be the same.

Each of the diode portions 80 includes a cathode region of N+ type in a region in contact with the lower surface of the semiconductor substrate 10. In the present specification, a region where the cathode region is provided is referred to as the diode portion 80. In other words, the diode portion 80 is a region that overlaps with the cathode region in the top view. On the lower surface of the semiconductor substrate 10, a collector region of the P+ type may be provided in a region other than the cathode region. In the present specification, the diode portion 80 may also include an extension region 81 where the diode portion 80 extends to a gate runner described below in the Y axis direction. The collector region is provided on a lower surface of the extension region 81.

The transistor portion 70 has the collector region of the P+ type in a region in contact with the lower surface of the semiconductor substrate 10. Further, in the transistor portion 70, an emitter region of the N type, a base region of the P type, and a gate structure having a gate conductive portion and a gate dielectric film are periodically arranged on the upper surface side of the semiconductor substrate 10.

The semiconductor device 100 may have one or more pads above the semiconductor substrate 10. The semiconductor device 100 of this example has a gate pad 164. The semiconductor device 100 may have a pad such as an anode pad, a cathode pad, and a current detection pad. Each pad is arranged in a region close to the end side 162. The region close to the end side 162 indicates a region between the end side 162 and the emitter electrode in the top view. When the semiconductor device 100 is mounted, each pad may be connected to an external circuit via a wiring such as a wire.

A gate potential is applied to the gate pad 164. The gate pad 164 is electrically connected to a conductive portion of a gate trench portion of the active portion 160. The semiconductor device 100 includes a gate runner that connects the gate pad 164 and the gate trench portion. In FIG. 1, the gate runner is hatched with diagonal lines.

The gate runner of this example has an outer circumferential gate runner 130 and an active-side gate runner 131. The outer circumferential gate runner 130 is arranged between the active portion 160 and the end side 162 of the semiconductor substrate 10 in the top view. The outer circumferential gate runner 130 of this example encloses the active portion 160 in the top view. A region enclosed by the outer circumferential gate runner 130 in the top view may be the active portion 160. In addition, a well region is formed below the gate runner. The well region is a region of the P type having a higher concentration than the base region described below, and is formed to a position deeper than the base region from the upper surface of the semiconductor substrate 10. A region surrounded by the well region in the top view may be the active portion 160.

The outer circumferential gate runner 130 is connected to the gate pad 164. The outer circumferential gate runner 130 is arranged above the semiconductor substrate 10. The outer circumferential gate runner 130 may be a metal wiring including aluminum or the like.

The active-side gate runner 131 is provided in the active portion 160. Providing the active-side gate runner 131 in the active portion 160 can reduce a variation in wiring length from the gate pad 164 for each region of the semiconductor substrate 10.

The outer circumferential gate runner 130 and the active-side gate runner 131 are connected to the gate trench portion of the active portion 160. The outer circumferential gate runner 130 and the active-side gate runner 131 are arranged above the semiconductor substrate 10. The outer circumferential gate runner 130 and the active-side gate runner 131 may be a wiring formed of a semiconductor such as polysilicon doped with an impurity.

The active-side gate runner 131 may be connected to the outer circumferential gate runner 130. The active-side gate runner 131 of this example is provided extending in the X axis direction so as to cross the active portion 160 from one outer circumferential gate runner 130 to the other outer circumferential gate runner 130 substantially at the center of the Y axis direction, the outer circumferential gate runner 130 enclosing the active portion 160. When the active portion 160 is divided by the active-side gate runner 131, the transistor portion 70 and the diode portion 80 may be alternately arranged in the X axis direction in each divided region.

Further, the semiconductor device 100 may include a temperature sensing portion (not shown) that is a PN junction diode formed of polysilicon or the like, and a current detection portion (not shown) that simulates an operation of the transistor portion provided in the active portion 160.

The semiconductor device 100 of this example includes an edge termination structure portion 90 between the active portion 160 and the end side 162 in the top view. The edge termination structure portion 90 of this example is arranged between the outer circumferential gate runner 130 and the end side 162. The edge termination structure portion 90 reduces an electric field strength on the upper surface side of the semiconductor substrate 10. The edge termination structure portion 90 may include at least one of a guard ring, a field plate, and a RESURF which are annularly provided to enclose the active portion 160.

Figure 2:
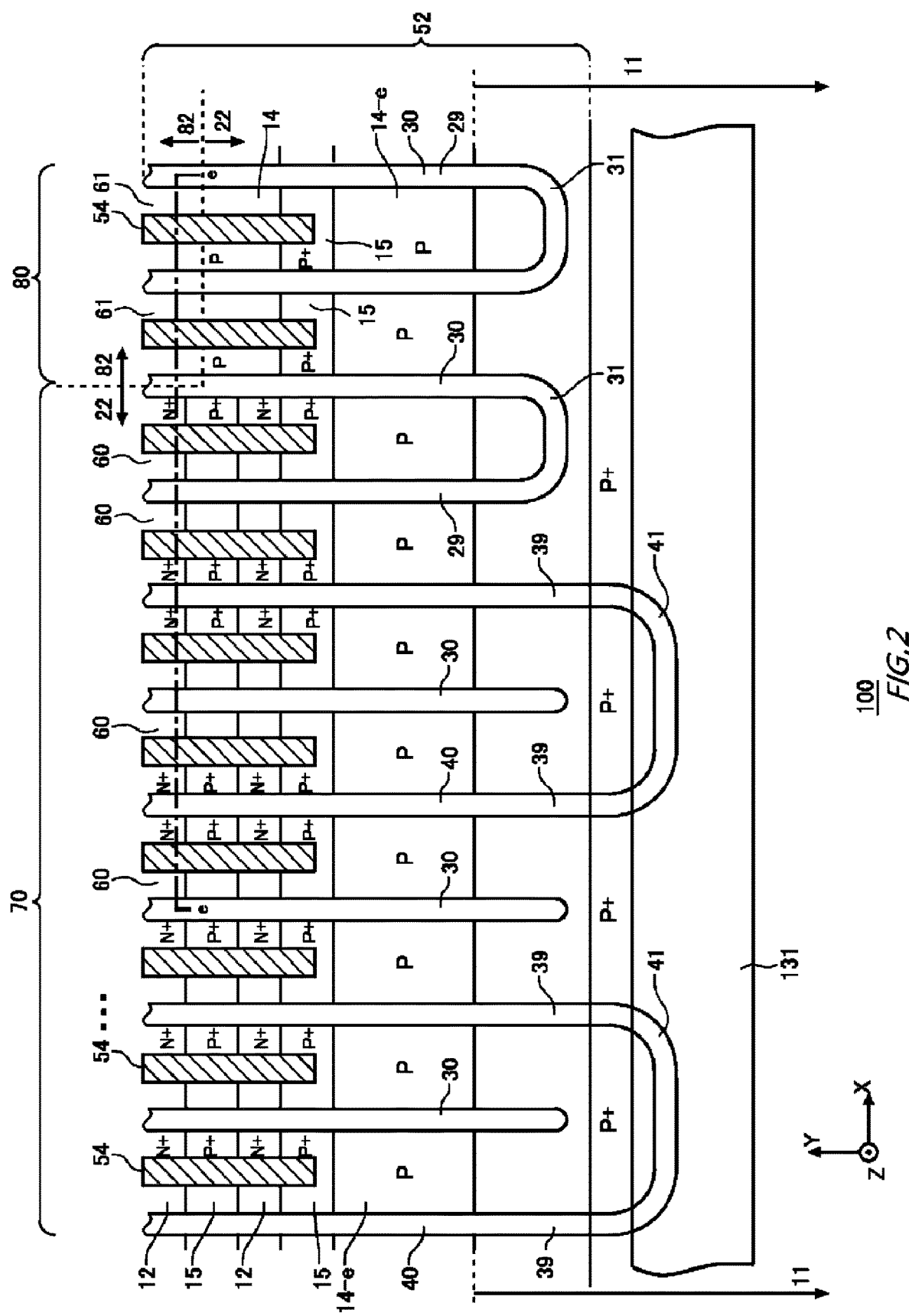
FIG. 2 is an enlarged view of a region D in FIG. 1.

FIG. 2 illustrates an enlarged view of a region D in FIG. 1. The region D is a region including the transistor portion 70, the diode portion 80, and the active-side gate runner 131. The semiconductor device 100 of this example includes a gate trench portion 40, a dummy trench portion 30, a well region 11, an emitter region 12, a base region 14, and a contact region 15 which are provided inside the upper surface side of the semiconductor substrate 10. The gate trench portion 40 and the dummy trench portion 30 each are an example of the trench portion. Further, the semiconductor device 100 of this example includes an emitter electrode 52 and the active-side gate runner 131 that are provided above the upper surface of the semiconductor substrate 10. The emitter electrode 52 and the active-side gate runner 131 are provided in isolation each other.

An interlayer dielectric film is provided between the emitter electrode 52 and the active-side gate runner 131, and the upper surface of the semiconductor substrate 10, but the interlayer dielectric film is omitted in FIG. 2. In the interlayer dielectric film of this example, a contact hole 54 is provided passing through the interlayer dielectric film. In FIG. 2, each contact hole 54 is hatched with the diagonal lines.

The emitter electrode 52 is provided on the upper side of the gate trench portion 40, the dummy trench portion 30, the well region 11, the emitter region 12, the base region 14, and the contact region 15. The emitter electrode 52 is in contact with the emitter region 12, the contact region 15, and the base region 14 on the upper surface of the semiconductor substrate 10, through the contact hole 54. Further, the emitter electrode 52 is connected to a dummy conductive portion in the dummy trench portion 30 through the contact hole provided in the interlayer dielectric film. The emitter electrode 52 may be connected to the dummy conductive portion of the dummy trench portion 30 at an edge of the dummy trench portion 30 in the Y axis direction. The dummy conductive portion of the dummy trench portion 30 may not be connected to the emitter electrode 52 and the gate conductive portion, and may be controlled to be set at a potential different from the potential of the emitter electrode 52 and the potential of the gate conductive portion.

The active-side gate runner 131 is connected to the gate trench portion 40 through the contact hole provided in the interlayer dielectric film. The active-side gate runner 131 may be connected to a gate conductive portion of the gate trench portion 40 at an edge portion 41 of the gate trench portion 40 in the Y axis direction. The active-side gate runner 131 is not connected to the dummy conductive portion in the dummy trench portion 30.

The emitter electrode 52 is formed of a material including a metal. FIG. 2 shows a range where the emitter electrode 52 is provided. For example, at least a part of a region of the emitter electrode 52 is formed of aluminum or an aluminum-silicon alloy, for example, a metal alloy such as AlSi and AlSiCu. The emitter electrode 52 may have a barrier metal formed of titanium, a titanium compound, or the like below a region formed of aluminum or the like. Further, a plug, which is formed by embedding tungsten or the like so as to be in contact with the barrier metal and aluminum or the like, may be included in the contact hole.

The well region 11 is provided overlapping the active-side gate runner 131. The well region 11 is provided so as to extend with a predetermined width even in a range not overlapping the active-side gate runner 131. The well region 11 of this example is provided away from an end of the contact hole 54 in the Y axis direction toward the active-side gate runner 131 side. The well region 11 is a second conductivity type region in which the doping concentration is higher than the base region 14. The base region 14 of this example is a P− type, and the well region 11 is a P+ type.

Each of the transistor portion 70 and the diode portion 80 includes a plurality of trench portions arranged in the array direction. In the transistor portion 70 of this example, one or more gate trench portions 40 and one or more dummy trench portions 30 are alternately provided along the array direction. In the diode portion 80 of this example, the plurality of dummy trench portions 30 are provided along the array direction. In the diode portion 80 of this example, the gate trench portion 40 is not provided.

The gate trench portion 40 of this example may have two linear portions 39 extending along the extending direction perpendicular to the array direction (portions of a trench that are linear along the extending direction), and the edge portion 41 connecting the two linear portions 39. The extending direction in FIG. 2 is the Y axis direction.

At least a part of the edge portion 41 is desirably provided in a curved shape in a top view. By connecting between end portions of the two linear portions 39 in the Y axis direction by the edge portion 41, it is possible to reduce the electric field strength at the end portions of the linear portions 39.

In the transistor portion 70, the dummy trench portions 30 are provided between the respective linear portions 39 of the gate trench portions 40. Between the respective linear portions 39, one dummy trench portion 30 may be provided or a plurality of dummy trench portions 30 may be provided. The dummy trench portion 30 may have a linear shape extending in the extending direction, or may have linear portions 29 and an edge portion 31 similar to the gate trench portion 40. The semiconductor device 100 shown in FIG. 2 includes both of the linear dummy trench portion 30 having no edge portion 31, and the dummy trench portion 30 having the edge portion 31.

A diffusion depth of the well region 11 may be deeper than the depth of the gate trench portion 40 and the dummy trench portion 30. The end portions in the Y axis direction of the gate trench portion 40 and the dummy trench portion 30 are provided in the well region 11 in a top view. In other words, the bottom in the depth direction of each trench portion is covered with the well region 11 at the end portion in the Y axis direction of each trench portion. With this configuration, the electric field strength on the bottom portion of each trench portion can be reduced.

A mesa portion is provided between the respective trench portions in the array direction. The mesa portion refers to a region sandwiched between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion of this example is provided extending in the extending direction (the Y axis direction) along the trench portion, on the upper surface of the semiconductor substrate 10. In this example, a mesa portion 60 is provided in the transistor portion 70, and a mesa portion 61 is provided in the diode portion 80. In the case of simply mentioning "mesa portion" in the present specification, the portion refers to each of the mesa portion 60 and the mesa portion 61.

Each mesa portion is provided with the base region 14. In the mesa portion, a region arranged closest to the active-side gate runner 131, in the base region 14 exposed on the upper surface of the semiconductor substrate 10, is to be a base region 14-e. While FIG. 2 shows the base region 14-e arranged at one end portion of each mesa portion in the extending direction, the base region 14-e is also arranged at the other end portion of each mesa portion. Each mesa portion may be provided with at least one of a first conductivity type of emitter region 12, and a second conductivity type of contact region 15 in a region sandwiched between the base regions 14-e in the top view. The emitter region 12 of this example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed on the upper surface of the semiconductor substrate 10. The emitter region 12 is provided in contact with the gate trench portion 40. The mesa portion 60 in contact with the gate trench portion 40 may be provided with the contact region 15 exposed on the upper surface of the semiconductor substrate 10.

Each of the contact region 15 and the emitter region 12 in the mesa portion 60 is provided from one trench portion to the other trench portion in the X axis direction. As an example, the contact region 15 and the emitter region 12 in the mesa portion 60 are alternately arranged along the extending direction of the trench portion (the Y axis direction).

In another example, the contact region 15 and the emitter region 12 in the mesa portion 60 may be provided in a stripe shape along the extending direction of the trench portion (the Y axis direction). For example, the emitter region 12 is provided in a region in contact with the trench portion, and the contact region 15 is provided in a region sandwiched between the emitter regions 12.

The mesa portion 61 of the diode portion 80 is not provided with the emitter region 12.

The base region 14 and the contact region 15 may be provided on an upper surface of the mesa portion 61. In the region sandwiched between the base regions 14-e on the upper surface of the mesa portion 61, the contact region 15 may be provided in contact with each base region 14-e. The base region 14 may be provided in a region sandwiched between the contact regions 15 on the upper surface of the mesa portion 61. The base region 14 may be arranged in the entire region sandwiched between the contact regions 15.

The contact hole 54 is provided above each mesa portion. The contact hole 54 is arranged in the region sandwiched between the base regions 14-e. The contact hole 54 of this example is provided above respective regions of the contact region 15, the base region 14, and the emitter region 12. The contact hole 54 is not provided in regions corresponding to the base region 14-e and the well region 11. The contact hole 54 may be arranged at the center of the mesa portion 60 in the array direction (the X axis direction).

In the diode portion 80, a cathode region 82 of the N+ type is provided in a region in direct contact with the lower surface of the semiconductor substrate 10. On the lower surface of the semiconductor substrate 10, a collector region of the P+ type 22 may be provided in a region where the cathode region 82 is not provided. The cathode region 82 and the collector region 22 are provided between a lower surface 23 of the semiconductor substrate 10 and a buffer region 20. In FIG. 2, a boundary between the cathode region 82 and the collector region 22 is indicated by a dotted line.

The cathode region 82 is arranged separately from the well region 11 in the Y axis direction. With this configuration, the distance between the P type region (the well region 11) having a relatively high doping concentration and formed up to the deep position, and the cathode region 82 is ensured, so that the breakdown voltage can be improved. The end portion in the Y axis direction of the cathode region 82 of this example is arranged farther away from the well region 11 than the end portion in the Y axis direction of the contact hole 54. In another example, the end portion in the Y axis direction of the cathode region 82 may be arranged between the well region 11 and the contact hole 54.

Figure 3:
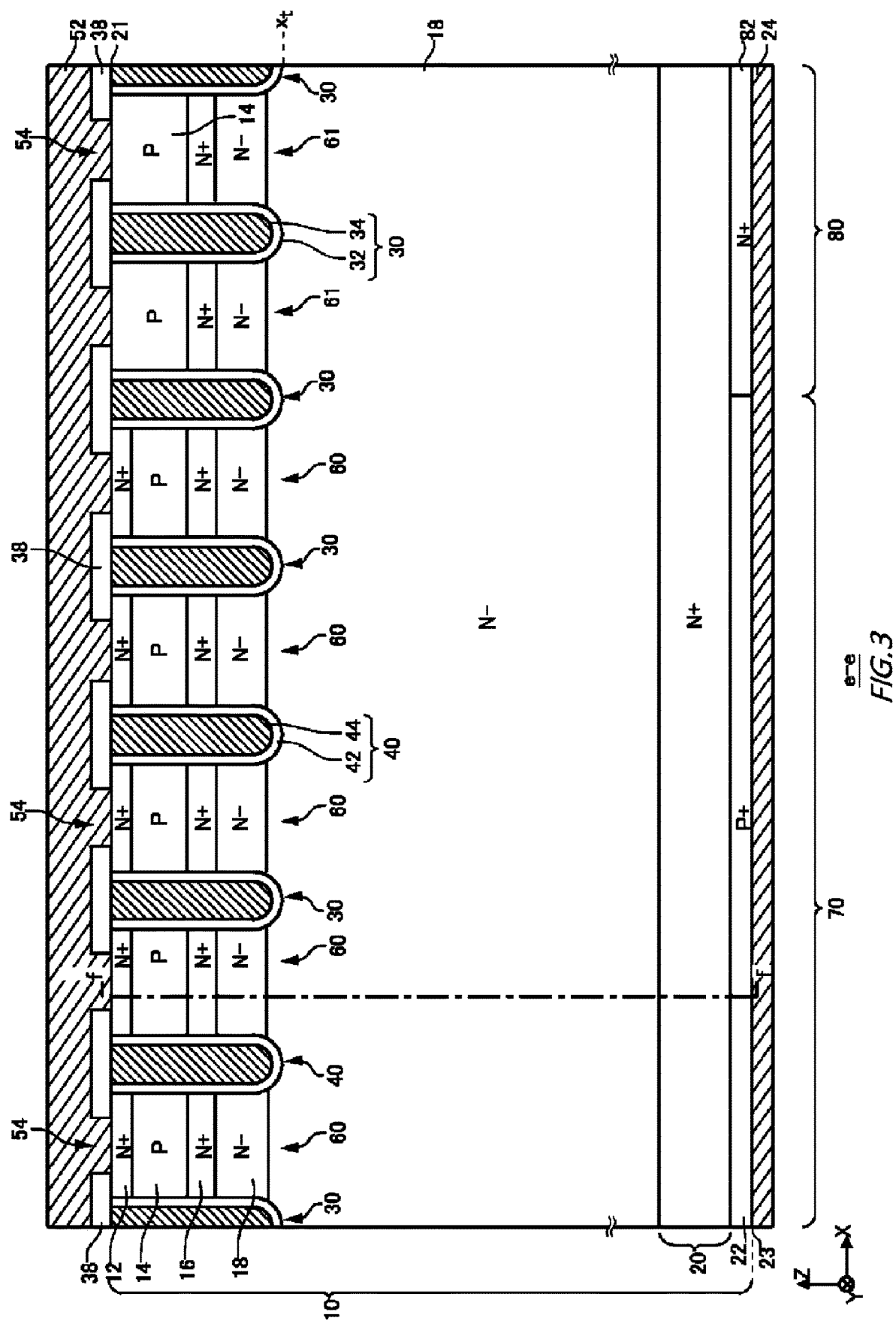
FIG. 3 illustrates an example of a cross section e-e in FIG. 2.

FIG. 3 illustrates a view showing an example of a cross section e-e in FIG. 2. The cross section e-e is an XZ plane passing through the emitter region 12 and the cathode region 82. The semiconductor device 100 of this example includes the semiconductor substrate 10, the interlayer dielectric film 38, the emitter electrode 52, and the collector electrode 24 in the cross section.

The interlayer dielectric film 38 is provided on the upper surface of the semiconductor substrate 10. The interlayer dielectric film 38 is a film including at least one layer of a dielectric film such as silicate glass to which an impurity such as boron or phosphorous is added, a thermal oxide film, and other dielectric films. The interlayer dielectric film 38 is provided with the contact hole 54 described in FIG. 2.

The emitter electrode 52 is provided on the upper side of the interlayer dielectric film 38. The emitter electrode 52 is in contact with an upper surface 21 of the semiconductor substrate 10 through the contact hole 54 of the interlayer dielectric film 38. The collector electrode 24 is provided on a lower surface 23 of the semiconductor substrate 10. The emitter electrode 52 and the collector electrode 24 are formed of a metal material such as aluminum. In the specification, the direction in which the emitter electrode 52 is connected to the collector electrode 24 (the Z axis direction) is referred to as a depth direction.

The semiconductor substrate 10 includes a drift region 18 of the N type or the N− type. The drift region 18 is provided in each of the transistor portion 70 and the diode portion 80.

In the mesa portion 60 of the transistor portion 70, an N+ type of emitter region 12 and a P− type of base region 14 are provided in order from an upper surface 21 side of the semiconductor substrate 10. The drift region 18 is provided below the base region 14. The mesa portion 60 may be provided with an N+ type of accumulation region 16. The accumulation region 16 is arranged between the base region 14 and the drift region 18.

The emitter region 12 is exposed on the upper surface 21 of the semiconductor substrate 10 and is provided in contact with the gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of this example is provided in contact with the emitter region 12. The base region 14 may be in contact with the trench portions on both sides of the mesa portion 60.

The accumulation region 16 is provided below the base region 14. The accumulation region 16 is an N+ type region with a higher doping concentration than the drift region 18. That is, the accumulation region 16 has a higher donor concentration than the drift region 18. By providing the accumulation region 16 having the high concentration between the drift region 18 and the base region 14, it is possible to improve a carrier injection enhancement effect (IE effect) and reduce an on-voltage. The accumulation region 16 may be provided to cover a whole lower surface of the base region 14 in each mesa portion 60.

The mesa portion 61 of the diode portion 80 is provided with the P− type of base region 14 in contact with the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, an N+ type buffer region 20 may be provided below the drift region 18. The doping concentration of the buffer region 20 is higher than the doping concentration of the drift region 18. The buffer region 20 may have a concentration peak having a doping concentration higher than that of the drift region 18. The doping concentration of the concentration peak indicates a doping concentration at the local maximum of the concentration peak. Further, as the doping concentration of the drift region 18, an average value of doping concentrations in the region where the doping concentration distribution is substantially flat may be used.

The buffer region 20 may have two or more concentration peaks in the depth direction (Z axis direction) of the semiconductor substrate 10. The concentration peak of the buffer region 20 may be provided at the same depth position as, for example, a chemical concentration peak of hydrogen (a proton) or phosphorous. The buffer region 20 may function as a field stopper layer which prevents a depletion layer expanding from the lower end of the base region 14 from reaching the collector region of the P+ type 22 and the cathode region 82 of the N+ type.

In the transistor portion 70, the collector region of the P+ type 22 is provided below the buffer region 20. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron.

Below the buffer region 20 in the diode portion 80, the cathode region 82 of the N+ type is provided. A donor concentration of the cathode region 82 is higher than a donor concentration of the drift region 18. A donor of the cathode region 82 is, for example, hydrogen or phosphorous. Note that an element serving as a donor and an acceptor in each region is not limited to the above-described example. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion passes through the base region 14 from the upper surface 21 of the semiconductor substrate 10, and is provided to below the base region 14. In a region where at least any one of the emitter region 12, the contact region 15, and the accumulation region 16 is provided, each trench portion also passes through the doping regions of these. The configuration of the trench portion penetrating the doping region is not limited to the one manufactured in the order of forming the doping region and then forming the trench portion. The configuration of the trench portion penetrating the doping region includes a configuration of the doping region being formed between the trench portions after forming the trench portion.

As described above, the transistor portion 70 is provided with the gate trench portion 40 and the dummy trench portion 30. In the diode portion 80, the dummy trench portion 30 is provided, and the gate trench portion 40 is not provided. The boundary in the X axis direction between the diode portion 80 and the transistor portion 70 in this example is the boundary between the cathode region 82 and the collector region 22.

The gate trench portion 40 includes a gate trench provided in the upper surface 21 of the semiconductor substrate 10, a gate dielectric film 42, and a gate conductive portion 44. The gate dielectric film 42 is provided to cover the inner wall of the gate trench. The gate dielectric film 42 may be formed by oxidizing or nitriding a semiconductor on the inner wall of the gate trench. The gate conductive portion 44 is provided inside from the gate dielectric film 42 in the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross section. The dummy trench portion 30 includes a dummy trench provided in the upper surface 21 of the semiconductor substrate 10, a dummy dielectric film 32, and a dummy conductive portion 34. The dummy conductive portion 34 is electrically connected to the emitter electrode 52. The dummy dielectric film 32 is provided covering an inner wall of the dummy trench. The dummy conductive portion 34 is provided in the dummy trench, and is provided inside the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon or the like. The dummy conductive portion 34 may have the same length as the gate conductive portion 44 in the depth direction.

The gate trench portion 40 and the dummy trench portion 30 of this example are covered with the interlayer dielectric film 38 on the upper surface 21 of the semiconductor substrate 10. It is noted that the bottom portions of the dummy trench portion 30 and the gate trench portion 40 may be formed in a curved-surface shape (a curved shape in the cross section) convexly downward. In the present specification, a depth position of a lower end of the gate trench portion 40 is defined as $x_t$.

Figure 4:
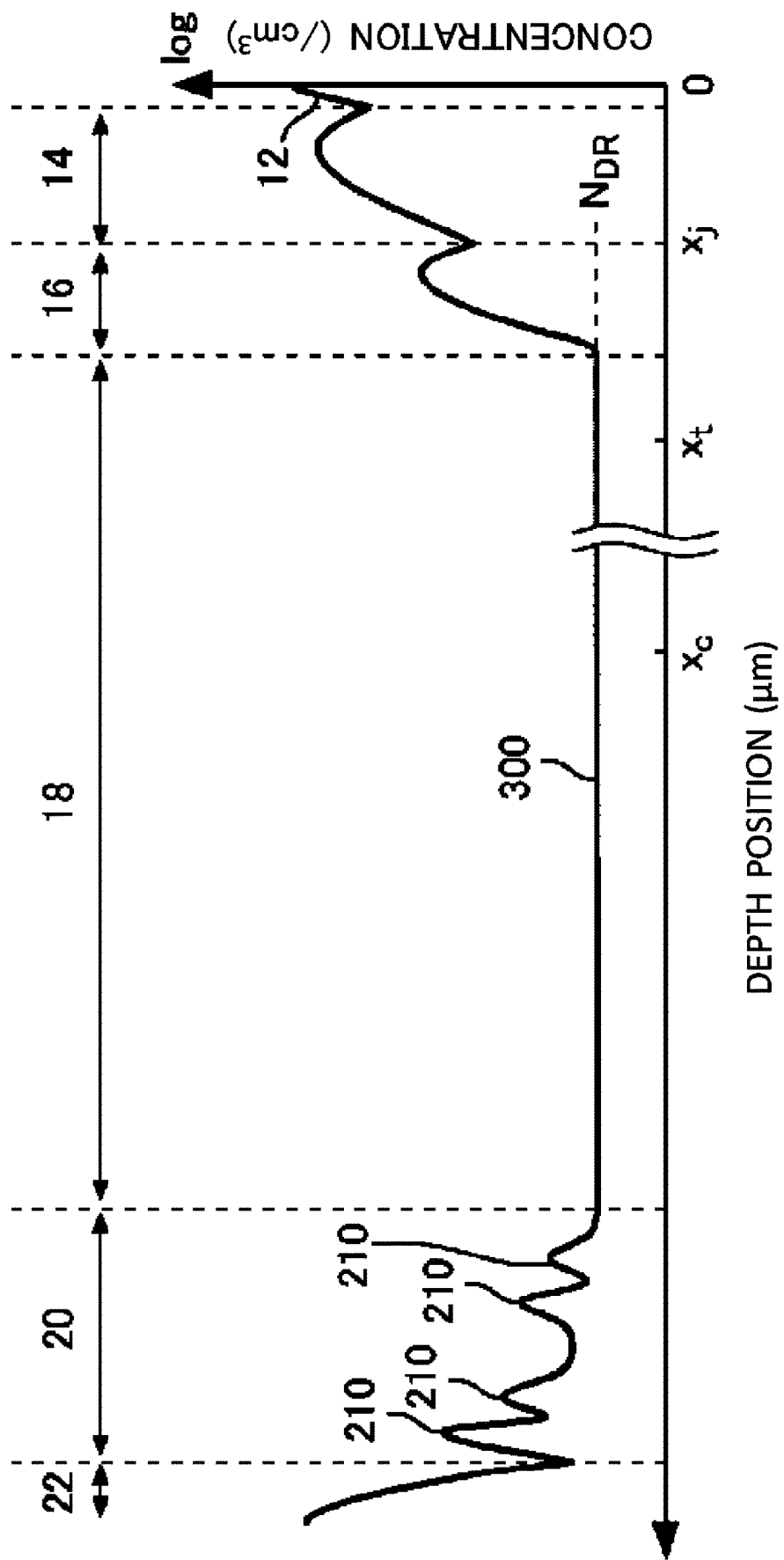
FIG. 4 illustrates an example of a doping concentration distribution 300 in line f-f of FIG. 3.

FIG. 4 illustrates an example of a doping concentration distribution 300 in line f-f of FIG. 3. Line f-f is a line parallel to the Z axis that passes through the mesa portion 60. A horizontal axis in FIG. 4 represents a depth position (a position in the Z axis direction) in the semiconductor substrate 10. In the present specification, unless otherwise specified, the upper surface 21 of the semiconductor substrate 10 is defined as a reference position in the Z axis direction, and a distance from the upper surface 21 is defined as the position in the Z axis direction.

The drift region 18 is provided in the semiconductor substrate 10. The doping concentration of the drift region 18 may be substantially constant. The doping concentration $N_{DR}$ of the drift region 18 may be the same as the bulk donor concentration. In another example, the doping concentration of the drift region 18 may be higher than the bulk donor concentration. The emitter region 12, the base region 14, and the accumulation region 16 are provided on the upper surface 21 side of the semiconductor substrate 10. The emitter region 12, the base region 14, and the accumulation region 16 may each have a doping concentration peak.

The buffer region 20 is provided between the drift region 18 and the lower surface 23. The buffer region 20 has a plurality of doping concentration peaks 210 having a doping concentration higher than that of the drift region 18. In the example of FIG. 4, the number of doping concentration peaks 210 is four, but the number of doping concentration peaks 210 is not limited thereto. The collector region 22 is provided between the buffer region 20 and the lower surface 23. The collector region 22 may have a doping concentration peak. The collector region 22 is in contact with the lower surface 23.

When the semiconductor device 100 (the transistor portion 70 in this example) is turned off, a collector-emitter voltage $V_{ce}$ gradually increases, and a space charge region (also referred to as a depletion layer) expands toward the lower surface 23 from a depth position $x_j$ of PN junction (PN junction by the base region 14 and the accumulation region 16 in this example) on the upper surface 21 side. In a case where the space charge region reaches the vicinity of the local maximum of the doping concentration peak 210 when the voltage $V_{ce}$ is near the peak voltage, the voltage overshoot is likely to occur in the time waveform of the collector-emitter voltage $V_{ce}$. The position $x_j$ of the PN junction may be a position of the PN junction arranged closer to the upper surface 21 than the buffer region 20 and closest to the buffer region 20 in the depth direction. For example, in the example of FIG. 4, when the accumulation region 16 does not exist, the position of the PN junction by the drift region 18 and the base region 14 is set as the position $x_j$. In another example, the position $x_j$ of the PN junction may be a position of the PN junction serving as a starting point from which the depletion layer (space charge region) expands when a voltage is applied between the electrode (the collector electrode 24 in this example) formed on the lower surface 23 and the electrode (the emitter electrode 52 in this example) formed on the upper surface 21 in a state where the gate is turned off (that is, in a state where an off-voltage is applied to the gate conductive portion 44). For example, in the example of FIG. 4, the position of the PN junction between the base region 14 and the accumulation region 16 (the drift region 18 when the accumulation region 16 does not exist) is set as $x_j$. In another example, the position $x_j$ of the PN junction may be a position of the PN junction of a region (the base region 14 in this example) electrically connected to the electrode (the emitter electrode 52 in this example) formed on the upper surface 21 and a region (the accumulation region 16 or the drift region 18 in this example) having a conductivity type opposite to that of the region and provided closer to the lower surface 23 than the region. The space charge region is a region in which the space charge density has a finite value that is not 0.

In the semiconductor device 100, the lower end position of the space charge region when the voltage $V_{ce}$ is near the peak voltage is adjusted by adjusting the doping concentration distribution of the buffer region 20. As a result, the voltage overshoot in the time waveform of the voltage $V_{ce}$ is suppressed. Since the peak voltage of the voltage $V_{ce}$ does not exceed the avalanche breakdown voltage $V_B$ of the transistor portion 70, the avalanche breakdown voltage $V_B$, which is the highest possible value of the voltage $V_{ce}$, may be used as the peak voltage of the voltage $V_{ce}$. That is, in the semiconductor device 100, the lower end position of the space charge region when a voltage $V_{ce}$ is the avalanche breakdown voltage $V_B$ may be adjusted. Herein, the avalanche breakdown voltage $V_B$ may be a voltage when, in a case where a positive voltage is applied between an electrode (the collector electrode 24 in this example) formed on the lower surface 23 and an electrode (the emitter electrode 52 in this example) formed on the upper surface 21 in a state where the gate is off, the maximum electric field intensity near the PN junction reaches a critical electric field intensity, and avalanche breakdown occurs due to impact ionization. Note that the avalanche breakdown voltage $V_B$ may be calculated from the material of the semiconductor substrate 10 and the doping concentration distribution, and a specification value determined by a designer or the like of the semiconductor device 100 may be used.

Figure 5:
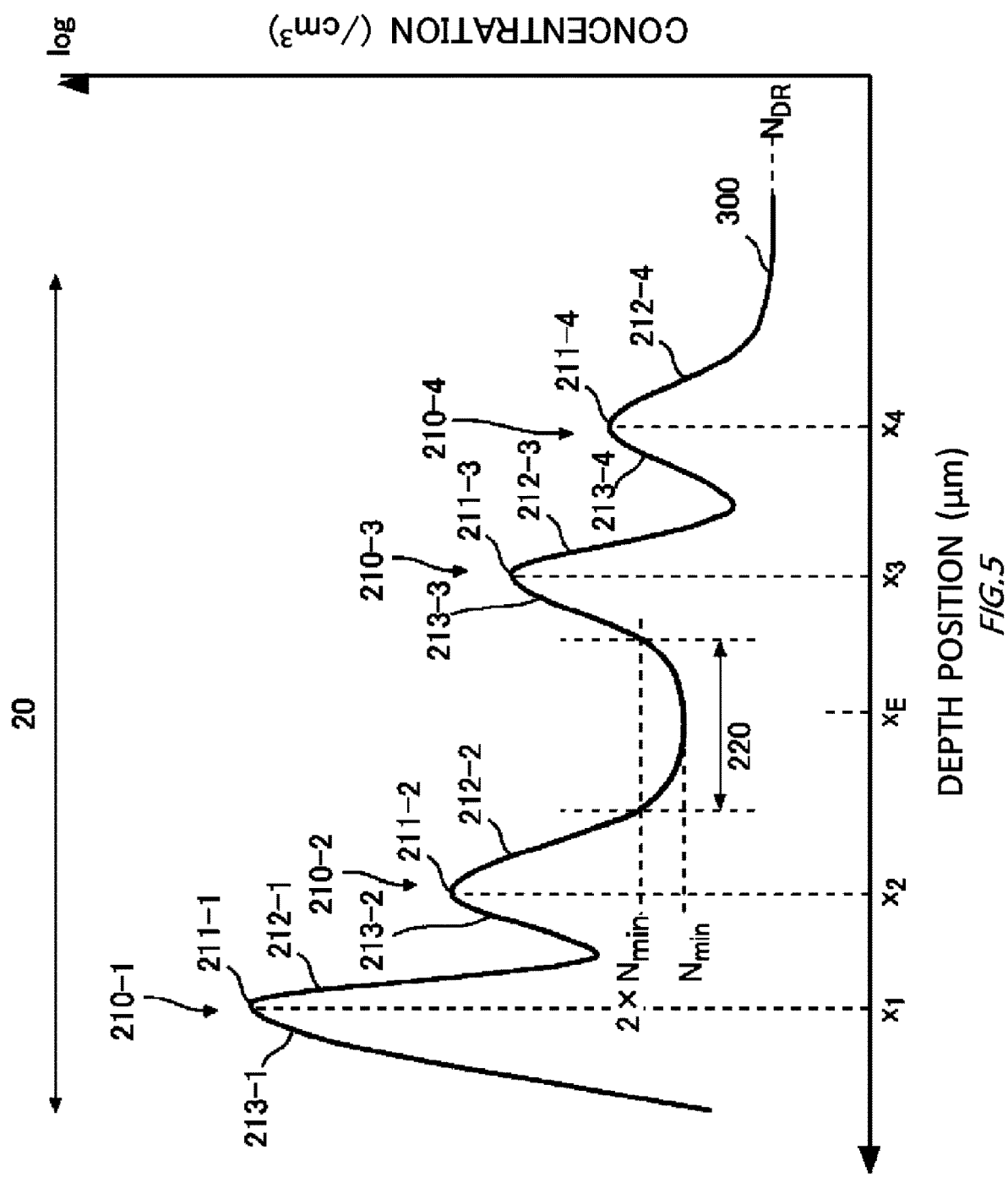
FIG. 5 is an enlarged view of the doping concentration distribution 300 of a buffer region 20.

FIG. 5 is an enlarged view of the doping concentration distribution 300 of the buffer region 20. The buffer region 20 has M (M is an integer of 2 or more) doping concentration peaks 210-$k$ ($k$ is an integer of 1 or more and M or less). In this example, the doping concentration peak 210-$k$ is the k-th doping concentration peak 210 when counted from the side close to the lower surface 23. That is, the doping concentration peak 210-1 is the doping concentration peak 210 closest to the lower surface 23, and the doping concentration peak 210-M is the doping concentration peak 210 farthest from the lower surface 23. In this example, M=4. M may be an integer of 2 or more, an integer of 3 or more, or an integer of 4 or more. M may be an integer of 100 or less, an integer of 50 or less, an integer of 30 or less, or an integer of 10 or less. In the example of FIG. 5, the doping concentration is higher as the doping concentration peak 210 is closer to the lower surface 23, but the present invention is not limited thereto. Note that the doping concentration peak 210-1 closest to the lower surface 23 is preferably higher in doping concentration than the other doping concentration peaks 210. The doping concentration peak 210-M farthest from the lower surface 23 may be lower or higher in doping concentration than an adjacent doping concentration peak 210-M−1.

Each of the doping concentration peaks 210-$k$ has a local maximum 211-$k$, an upper tail 212-$k$, and a lower tail 213-$k$. The local maximum 211-$k$ is a point at which the doping concentration exhibits a maximum value. A depth position $x_k$ of the local maximum 211-$k$ may be the depth position of each doping concentration peak 210-$k$.

The upper tail 212-$k$ is a portion where the doping concentration monotonically decreases from the local maximum 211-$k$ toward the upper surface 21. The lower tail 213-$k$ is a portion where the doping concentration monotonically decreases from the local maximum 211-$k$ toward the lower surface 23. The monotonic decrease indicates that the doping concentration decreases as a distance from the local maximum 211-$k$ increases.

When the collector-emitter voltage $V_{ce}$ reaches the peak voltage (or the avalanche breakdown voltage $V_B$) at the time of turn-off of the transistor portion 70, the lower end position of the space charge region expanding from the position $x_j$ toward the lower surface 23 is defined as $x_E$. The lower end position $x_E$ is preferably arranged at a position not overlapping with the local maximum 210-$k$ of any doping concentration peak 211-$k$. The lower end position $x_E$ may not be included in the range of the full width at half maximum of any doping concentration peak 210-$k$.

The lower end position $x_E$ of this example is arranged between the i-th doping concentration peak 210-$i$ when counted from the lower surface 23 and the (i+1)-th doping concentration peak 210-$i$+1 when counted from the lower surface 23. The region between the two doping concentration peaks 210 may refer to the region between two local maximums 211. In the example of FIG. 5, i=2. In other examples, i=1, and i may be other integers.

A peak-to-peak distance ($x_i$–$x_{i+1}$) between the doping concentration peak 210-$i$ and the doping concentration peak 210-$i$+1 is larger than a peak-to-peak distance ($x_{i+1}$–$x_{i+2}$) between the doping concentration peak 210-$i$+1 and the doping concentration peak 210-$i$+2. In the example of FIG. 5, a peak-to-peak distance ($x_2$–$x_3$) between the doping concentration peak 210-2 and the doping concentration peak 210-3 is larger than a peak-to-peak distance ($x_3$–$x_4$) between the doping concentration peak 210-3 and the doping concentration peak 210-4. By increasing the peak-to-peak distance ($x_i$–$x_{i+1}$), the lower end position $x_E$ can be easily arranged away from the local maximum 211. The peak-to-peak distance ($x_i$–$x_{i+1}$) may be 1.5 times or more, 2 times or more, or 3 times or more the peak-to-peak distance ($x_{i+1}$–$x_{i+2}$).

The peak-to-peak distance between the doping concentration peak 210-$i$ and the doping concentration peak 210-$i$+1 may be larger than any other peak-to-peak distance. With such a configuration, the lower end position $x_E$ can be easily arranged away from a local maximum 211-$i$ and a local maximum 211-$i$+1. In the example of FIG. 5, the peak-to-peak distance ($x_2$–$x_3$) is larger than any of the other peak-to-peak distances ($x_1$–$x_2$ and $x_3$–$x_4$). The peak-to-peak distance ($x_1$–$x_{i+1}$) may be 1.5 times or more, 2 times or more, or 3 times or more the maximum distance among other peak-to-peak distances.

The peak-to-peak distance ($x_i$–$x_{i+1}$) may be 8 μm or more. The peak-to-peak distance ($x_i$–$x_{i+1}$) may be 10 μm or more, and may be 15 μm or more.

The lower end position $x_E$ may be arranged in a range not overlapping with the upper tail 212-$i$ of the doping concentration peak 210-$i$. The lower end position $x_E$ may be arranged in a range not overlapping with the lower tail 213-$i$+1 of the doping concentration peak 210-$i$+1. As a result, it is possible to prevent that, in a state where the collector-emitter voltage $V_{ce}$ increases to the vicinity of the peak voltage and the space charge region extends to the vicinity of the lower end position $x_E$, the doping concentration increases as a distance from the lower end position $x_E$ decreases. As a result, the voltage overshoot can be suppressed.

The buffer region 20 may have a flat portion 220 between the two local maximums 211-$i$ and 211-$i$+1. The local minimum value of the doping concentration between the two local maximums 211-$i$ and 211-$i$+1 is defined as $N_{min}$. The flat portion 220 is a region, in which the doping concentration is $N_{min}$ or more and β×$N_{min}$ or less, between the two local maximums 211-$i$ and 211-$i$+1. β may be 3, 2, 1.5, or 1.3. The lower end position $x_E$ may be arranged in the flat portion 220. As a result, the lower end position $x_E$ can be arranged in a region where the doping concentration is low, and the voltage overshoot can be suppressed.

In order to arrange the lower end position $x_E$ at the position described in FIG. 5, the doping concentration distribution of the buffer region 20 is decided such that a charge carrier coefficient α represented by Expression (1) is 2000 or more and 50000 or less in any one integer i (i is an integer of 1 or more and M−1 or less). As an example, i=2, but the integer i is not limited thereto.

$$\frac{v_{sat}}{J_{rate}}\left(\frac{2\varepsilon_0\varepsilon_r V_B}{(x_i - x_j)^2} - N_D q\right) \leq \alpha \leq \frac{v_{sat}}{J_{rate}}\left(\frac{2\varepsilon_0\varepsilon_r V_B}{(x_{i+1} - x_j)} - N_D q\right) \quad (1)$$

where $v_{sat}$ is the saturation velocity (cm/s) of charge carriers, $J_{rate}$ is the rated current density (A/cm²) of the semiconductor device 100, $V_B$ is the avalanche breakdown voltage (V) of the semiconductor substrate 10, $x_i$ is the depth position (cm), from the upper surface 21, of the i-th doping concentration peak 210-$i$ when counted from the lower surface 23 among the plurality of doping concentration peaks 210 in the buffer region 20, $x_{i+1}$ is the depth position (cm), from the upper surface 21, of the (i+1)-th doping concentration peak 210-$i$+1 when counted from the lower surface 23 among the plurality of doping concentration peaks 210 in the buffer region 20, $x_j$ is the depth position (cm), from the upper surface 21, of the PN junction arranged closer to the upper surface 21 than the buffer region 20 and closest to the buffer region 20 in the depth direction, $N_{DR}$ is the doping concentration (/cm³) of the drift region 18, $\varepsilon_0$ is the dielectric constant of vacuum and is 8.85418×10$^{-14}$ (F/cm), $\varepsilon_r$ is the relative dielectric constant of the semiconductor substrate 10, and is 11.9 in the case of a silicon substrate and 6.5 to 10.0 in the case of a SiC substrate, q is an elementary charge, and is 1.60218×10$^{-19}$(C), and M is an integer of 2 or more and 100 or less. The saturation velocity $v_{sat}$ is the saturation velocity of holes to be minority carriers when the drift region 18 is n type as in this example.

Note that as each parameter described above, a specification value determined by the designer or manufacturer of the semiconductor device 100 may be used, or an actual measurement value may be used. As the doping concentration $N_{DR}$, the average value of the bulk doping concentration of the semiconductor substrate 10 may be used. In addition, as the doping concentration $N_{DR}$, a doping concentration at the center of the drift region 18 in the depth direction may be used. Next, the derivation of the charge carrier coefficient α will be described.

Figure 6:
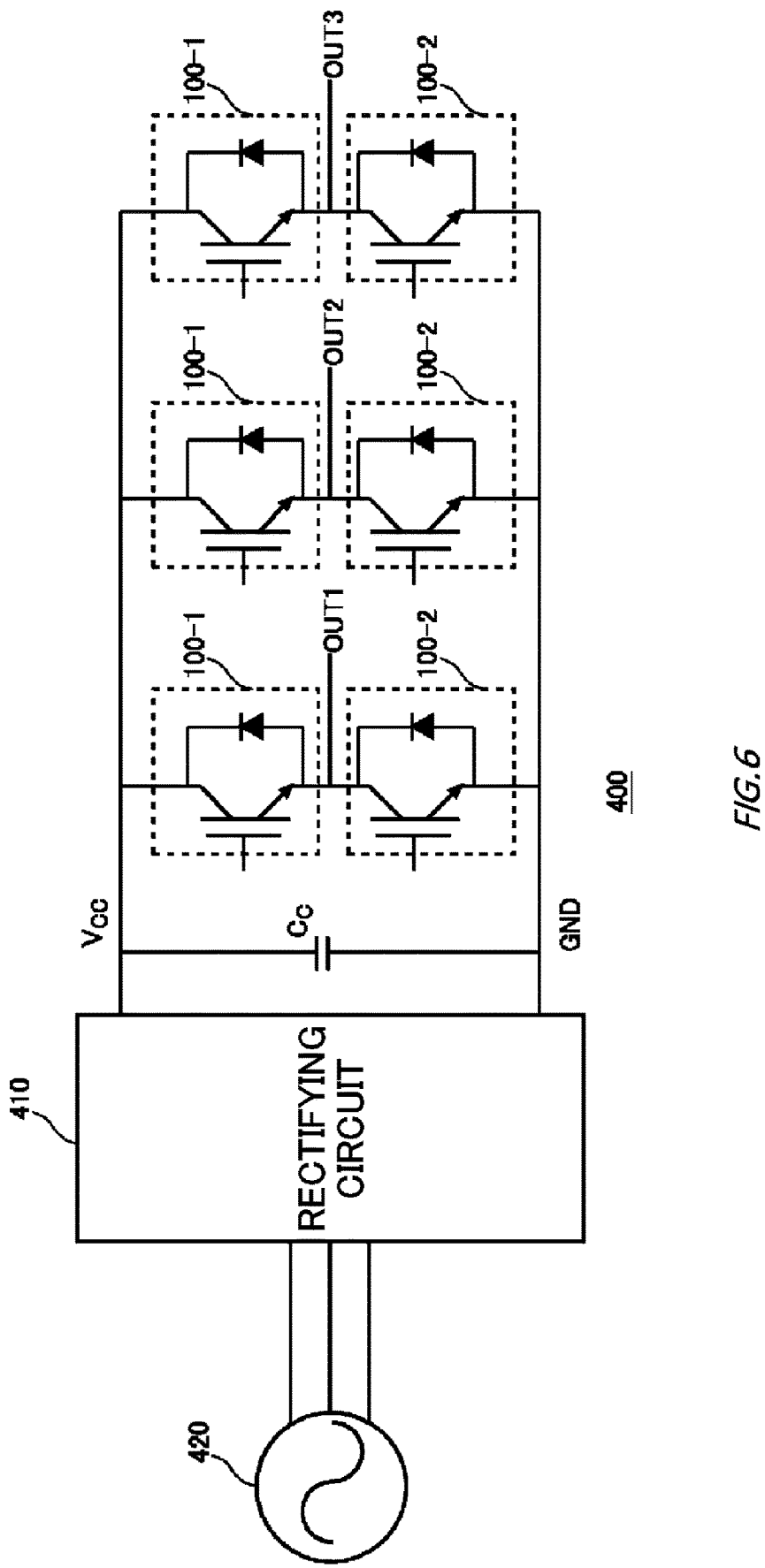
FIG. 6 is an example of a circuit 400 using the semiconductor device 100.

FIG. 6 is an example of a circuit 400 using the semiconductor device 100. The circuit 400 is a three-phase inverter circuit, but is not limited thereto. The circuit 400 includes an AC power supply 420, a rectifying circuit 410, a capacitor $C_c$, and a plurality of semiconductor devices 100. The rectifying circuit 410 and the capacitor $C_c$ convert an AC voltage from the AC power supply 420 into a DC voltage Vcc. The plurality of semiconductor devices 100 configure a three-phase inverter in which each phase circuit has an upper arm and a lower arm. On/off of the semiconductor device 100-1 of the upper arm and the semiconductor device 100-2 of the lower arm are complementarily controlled.

Figure 7:
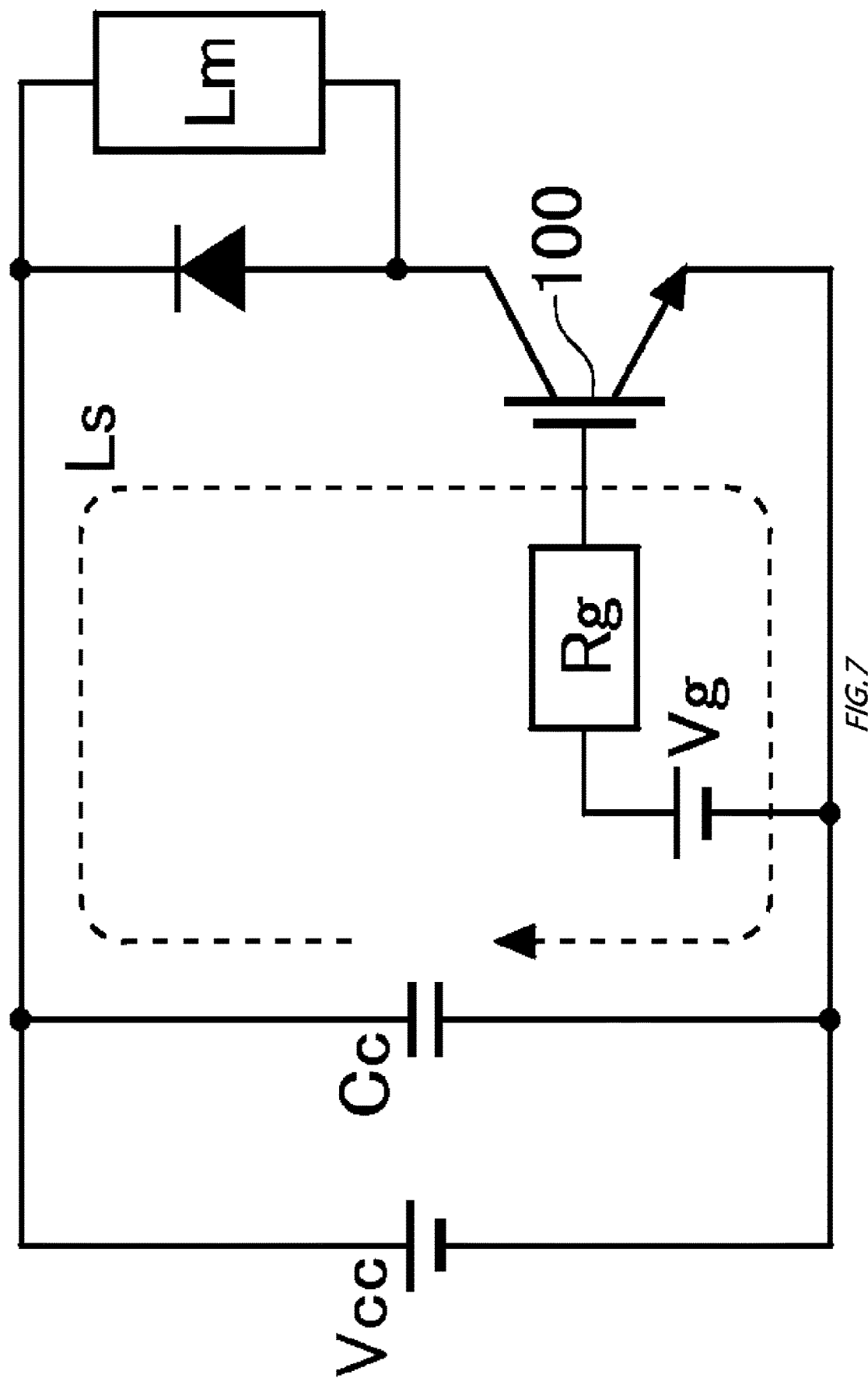
FIG. 7 schematically illustrates the semiconductor device 100 for one arm in FIG. 6.

FIG. 7 schematically illustrates a circuit to which the semiconductor device 100 for one arm in FIG. 6 is connected. Ls represents a floating inductance (H), Rg represents a gate resistance (Ω), Vg represents a gate applied voltage (V), Vcc represents a power supply voltage (V), Cc represents a capacitor capacitance (F), and Lm represents a load.

Figure 8:
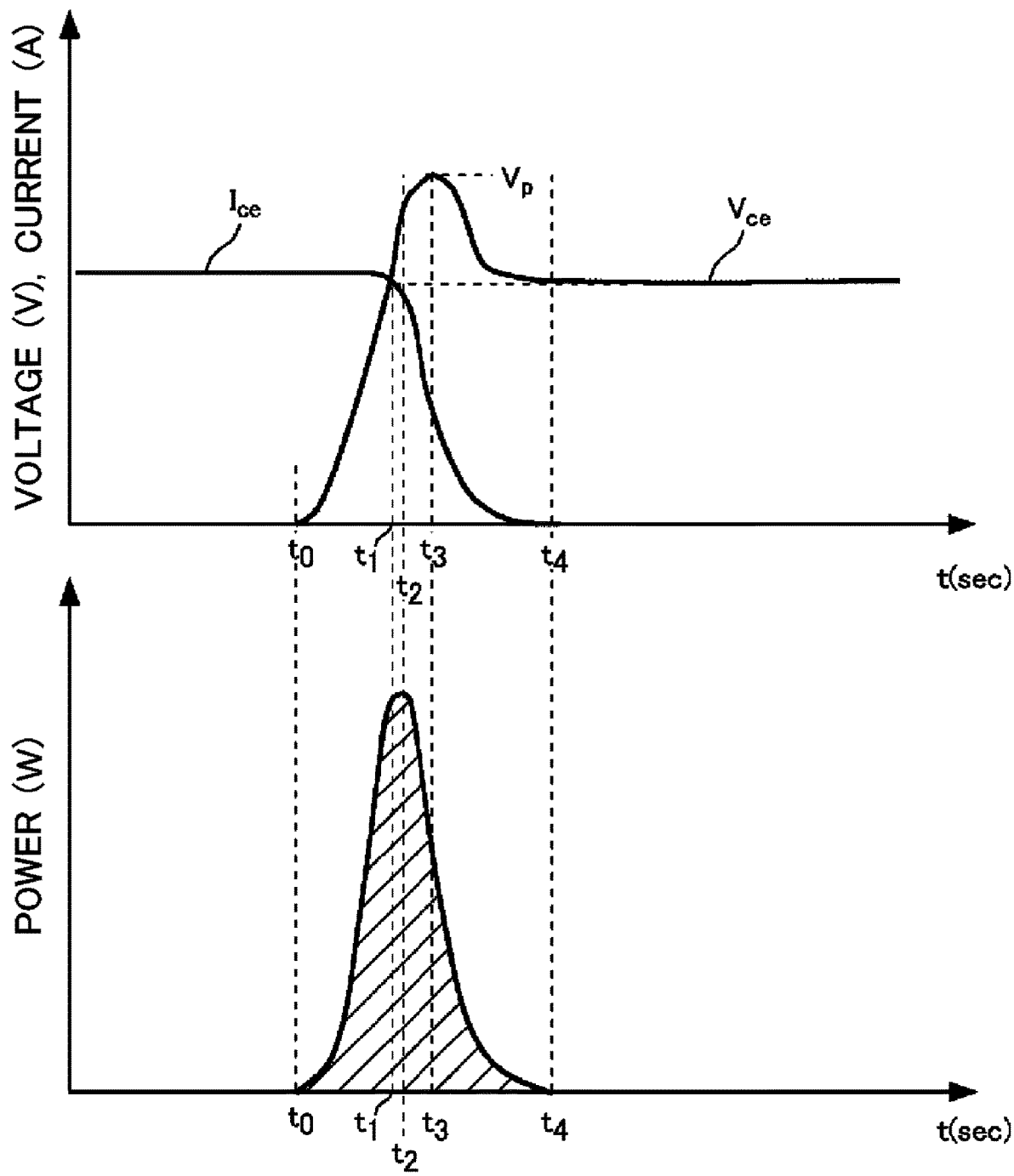
FIG. 8 illustrates an overview of time waveforms of a collector-emitter current $I_{ce}$, a collector-emitter voltage $V_{ce}$, and power (W) when the semiconductor device 100 illustrated in FIG. 6 is turned off.

FIG. 8 illustrates an overview of time waveforms of a collector-emitter current $I_{ce}$, the collector-emitter voltage $V_{ce}$, and power (W) when the semiconductor device 100 illustrated in FIG. 6 is turned off. The voltage $V_{ce}$ indicates the peak voltage $V_p$ at time $t_2$. The power (W) is a waveform of a product of the current $I_{ce}$ and the voltage $V_{ce}$. A value (a hatched area in the drawing) obtained by integrating the power (W) with time corresponds to the energy loss (J) of the semiconductor device 100. Time $t_0$ on the horizontal axis is a time at which the voltage $V_{ce}$ starts increasing from an on-voltage ($V_{ce(sat)}$). The power (W) also starts increasing at time $t_0$. Time $t_1$ is a time at which the increasing voltage $V_{ce}$ matches the power supply voltage $V_{cc}$. Time $t_2$ is a time at which the power (W) becomes the maximum value. Time $t_3$ is a time at which the voltage $V_{ce}$ reaches the maximum value $V_p$. Time $t_4$ is a time at which it can be determined that the current $I_{ce}$ or the power (W) is 0. The time at which the current $I_{ce}$ or the power (W) is 0 is, as an example, a time at which the current $I_{ce}$ or the power (W) becomes 1% or less with respect to each maximum value.

Figure 9:
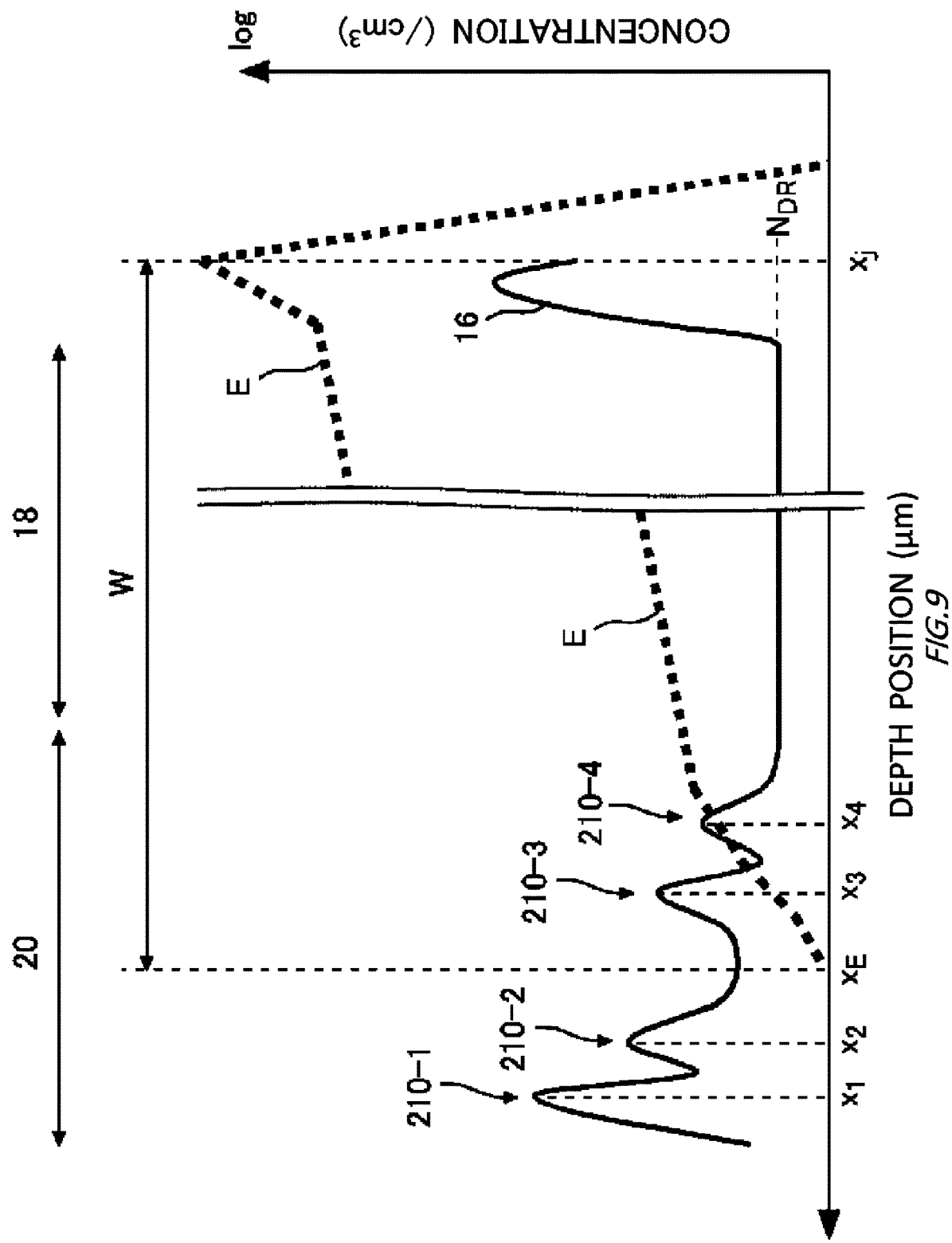
FIG. 9 illustrates a distribution example of an electric field intensity E from the vicinity of a depth position $x_j$ to the depth position $x_E$.

FIG. 9 illustrates a distribution example of an electric field intensity E from the vicinity of the depth position $x_j$ to the depth position $x_E$. In this example, a state in which the space charge region reaches the depth position $x_E$ at the time of turn-off is illustrated. In addition, in FIG. 9, the doping concentration distributions of the buffer region 20, the drift region 18, and the accumulation region 16 are illustrated together.

When the semiconductor device 100 is turned off, the space charge region expands from the position $x_j$ of the pn junction on the upper surface 21 side of the semiconductor substrate 10 toward the lower surface 23 side, corresponding to the collector-emitter voltage $V_{ce}$. The space charge region is also referred to as a depletion layer. In the space charge region, holes of about $1 \times 10^{13}$ to $1 \times 10^{14}$/cm$^3$ may exist at the time of switching.

The width of the space charge region in the depth direction at time $t_2$ at which the product (power) of the collector-emitter voltage $V_{ce}$ and the collector-emitter current $I_{ce}$ becomes maximum is defined as W. Note that the width of the space charge region in the depth direction at time $t_3$ at which the collector-emitter voltage $V_{ce}$ becomes maximum may be W.

The depth position $x_E$ of the end portion (space charge region end) on the lower surface 23 side of the space charge region of which the width in the depth direction is W is positioned between two doping concentration peaks 210 adjacent in the depth direction. For example, the depth position $x_E$ is arranged between the depth positions $x_2$ and $x_3$. The width W of the space charge region is generally obtained by solving the well-known Poisson's equation divE=p and E=-grad$\phi$ ($\phi$ is a potential inside the semiconductor device 100 at the time of turn-off).

Herein, since the collector-emitter voltage $V_{ce}$ does not exceed the avalanche breakdown voltage $V_B$ of the transistor portion 70, the voltage $V_{ce}$ is replaced with the voltage $V_B$. Furthermore, since the current density of the cutoff current of the transistor portion 70 in an inverter or the like is generally set to a level not exceeding the rated current density, the current density is defined as the rated current density. Then, the "charge carrier coefficient $\alpha$" is introduced as a dimensionless coefficient for absorbing a difference between the applied voltage and the voltage $V_B$ and indicating whether or not the lower end position $x_E$ of the space charge region is positioned between two adjacent doping concentration peaks 210. By the following Expression (2), the charge carrier coefficient $\alpha$ is defined as a coefficient for correcting a minority carrier (holes in many cases) concentration p in the space charge region at the time of turn-off.

$$W = \sqrt{\frac{2\varepsilon_0 \varepsilon_r V_B}{q\left(N_D + \alpha \frac{J_{rate}}{qv_{sat}}\right)}} \tag{2}$$

The term of $J_{rate}/qv_{sat}$ in Expression (2) is the hole concentration p in the space charge region. In the space charge region, the electric field intensity is a high electric field region of, for example, about $1 \times 10^5$ (V/cm), and thus, the velocity of the hole concentration p saturates in the space charge region, and further the concentration distribution becomes substantially uniform (constant value). That is, Expression (2) means that, when the charge carrier coefficient $\alpha$ is in a certain numerical range, in the case of turning off the semiconductor device 100 in which a current having a current density similar to the rated current density flows at a high voltage at which the collector-emitter voltage $V_{ce}$ does not exceed the avalanche breakdown voltage $V_B$, the width of the space charge region is W.

As described above, among the plurality of doping concentration peaks 210 in the buffer region 20, a depth position from the upper surface 21 of the i-th doping concentration peak 210-$i$ from the lower surface 23 defined as $x_i$ (cm), and a depth position from the upper surface 21 of the (i+1)-th doping concentration peak 210-$i$+1 from the lower surface 23 defined as $x_{i+1}$ (cm). Since the space charge region is formed with the width W from the depth position $x_j$ of the PN junction formed closer to the upper surface 21 than the buffer region 20 toward the lower surface 23, the depth position $x_E$ of the lower end of the space charge region is given by Expression (3). Herein, the width of the space charge region formed from the depth position $x_j$ of the PN junction toward the upper surface 21 is sufficiently smaller than the width of the space charge region formed from the depth position $x_j$ of the PN junction toward the lower surface 23.

$$x_E = x_j + W \tag{3}$$

On the other hand, Expression (4) is obtained when the depth position $x_E$ is positioned between $x_i$ and $x_{i+1}$.

$$x_{i+1} <= x_E <= x_i \tag{4}$$

Expression (5) is obtained when Expression (4) is transformed by using Expression (3).

$$x_{i+1} - x_j <= W <= x_i - x_j \tag{5}$$

Expression (1) is obtained when Expression (2) is substituted into Expression (5) to provide a solution for $\alpha$.

$$\frac{v_{sat}}{J_{rate}}\left(\frac{2\varepsilon_0 \varepsilon_r V_B}{(x_i - x_j)^2} - N_D q\right) \le \alpha \le \frac{v_{sat}}{J_{rate}}\left(\frac{2\varepsilon_0 \varepsilon_r V_B}{(x_{i+1} - x_j)^2} - N_D q\right) \tag{1}$$

That is, when the charge carrier coefficient $\alpha$ satisfies Expression (1), the lower end position $x_E$ of the space charge region having the width W can be arranged between the adjacent doping concentration peaks.

Figure 10:
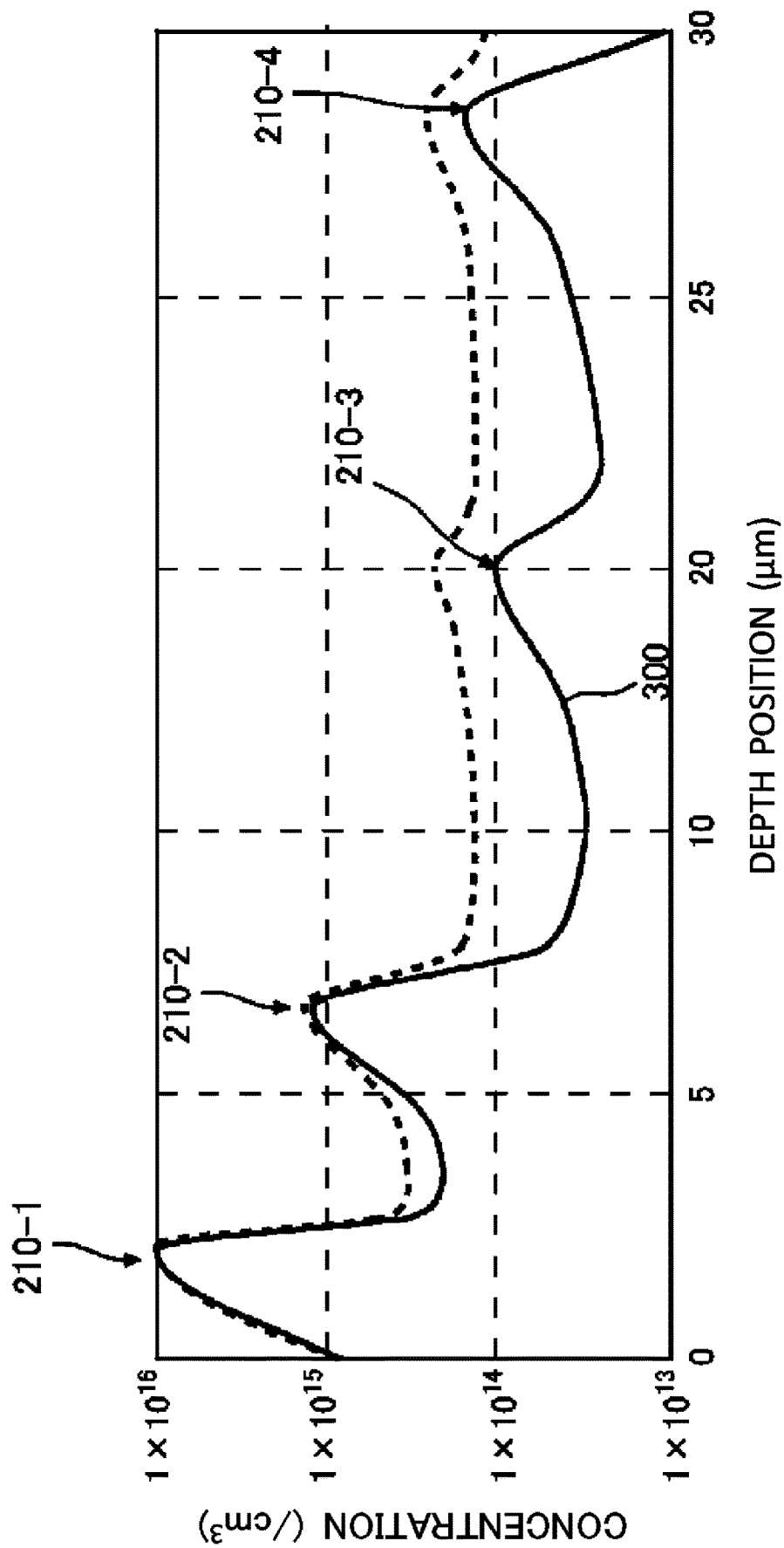
FIG. 10 illustrates a doping concentration distribution of the buffer region 20 according to one example.

FIG. 10 illustrates a doping concentration distribution of the buffer region 20 according to one example. The buffer region 20 of the this example has four doping concentration peaks 210. Note that, in the horizontal axis of FIG. 10, the lower surface 23 is defined as a depth position 0, and the depth from the lower surface 23 is illustrated. In FIG. 10, the collector region 22 is omitted. In FIG. 10, a waveform of a broken line indicates the net doping concentration, and a waveform of a solid line indicates the doping concentration distribution 300 obtained by subtracting the bulk doping concentration from the net doping concentration. The doping concentration distribution 300 may be a concentration distribution of hydrogen donors.

Parameters according to a first example (rated voltage 600V) illustrated in FIG. 10 are as follows.

$v_{sat}$: 9.00×10⁶ (cm/s)

Rated current density $J_{rate}$: 300 (A/cm²)
$\varepsilon_0$: 8.85×10⁻¹⁴ (F/cm)
$\varepsilon_r$: 11.9
Avalanche voltage $V_B$ of semiconductor device 100: 620 (V)
Thickness of semiconductor substrate 10: 60 (μm)
Depth position $x_j$ of PN junction: 2 (μm),
Distance of depth position $x_2$ from lower surface 23: 7.1 (μm)
Distance of depth position $x_3$ from lower surface 23: 14.1 (μm)
Distance $x_2-x_j$: 50.9 (μm)
Distance $x_3-x_j$: 43.9 (μm)
Bulk doping concentration $N_{D0}$: 1.1×10¹⁴ (/cm³), and
q: 1.60×10⁻¹⁹ (C)

In this example, when the lower end position $x_E$ of the space charge region is arranged between the doping concentration peak 210-2 and the doping concentration peak 210-3, the charge carrier coefficient α is 9883 or more and 15090 or less according to Expression (1).

Parameters according to a second example (rated voltage 1200V) different from the example illustrated in FIG. 10 are as follows.

$v_{sat}$: 9.00×10⁶ (cm/s)
Rated current density $J_{rate}$: 200 (A/cm²)
$\varepsilon_0$: 8.85×10⁻¹⁴ (F/cm)
$\varepsilon_r$: 11.9
Avalanche voltage $V_B$ of semiconductor device 100: 1400 (V)
Thickness of semiconductor substrate 10: 110 (μm)
Depth position $x_j$ of PN junction: 2 (μm),
Distance of depth position $x_2$ from lower surface 23: 7.1 (μm)
Distance of depth position $x_3$ from lower surface 23: 14.1 (μm)
Distance $x_2-x_j$: 100.9 (μm)
Distance $x_3-x_j$: 93.9 (μm)
Bulk doping concentration $N_{D0}$: 7×10¹³ (/cm³), and
q: 1.60×10⁻¹⁹ (C)

In this example, when the lower end position $x_E$ of the space charge region is arranged between the doping concentration peak 210-2 and the doping concentration peak 210-3, the charge carrier coefficient α is 7988 or more and 10003 or less according to Expression (1).

Figure 11:
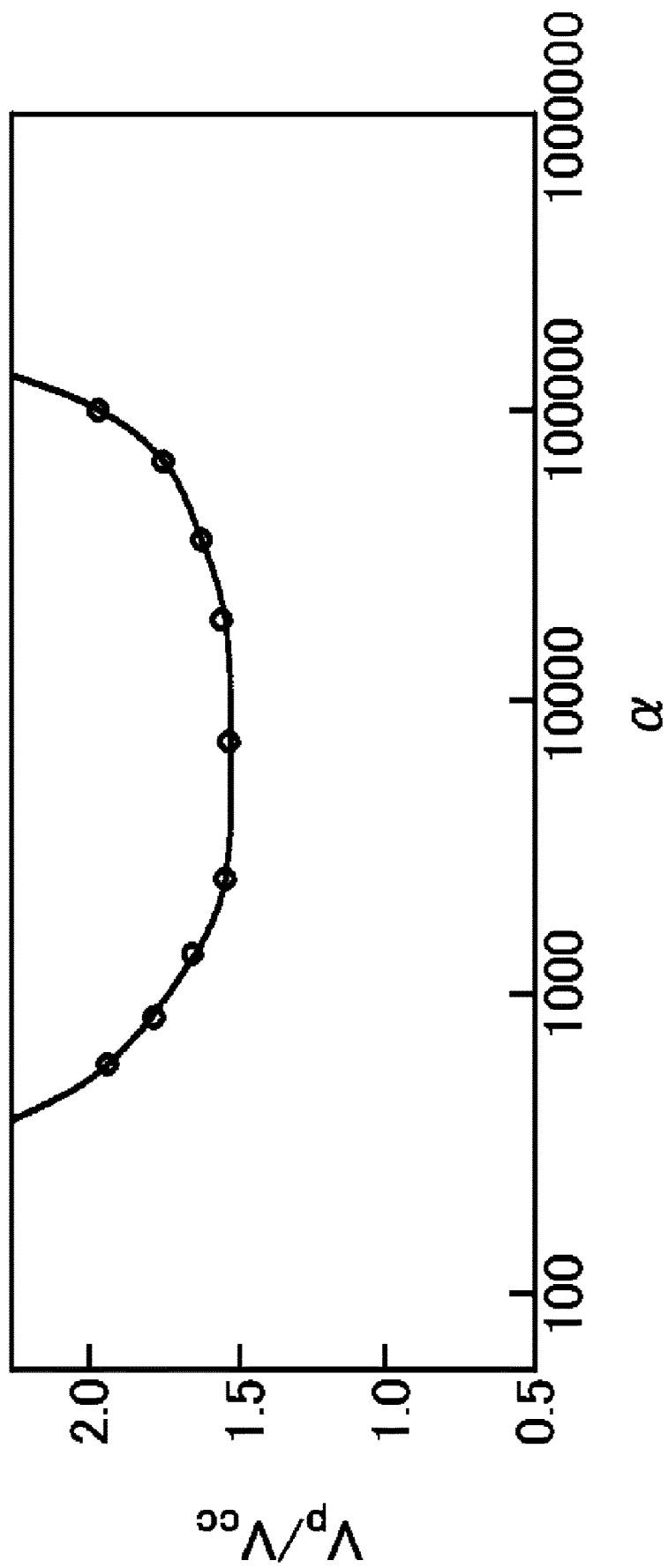
FIG. 11 illustrates a relationship between a charge carrier coefficient α and a peak voltage ratio ($V_p/V_{cc}$) in a first example (rated voltage 600V).

FIG. 11 illustrates a relationship between the charge carrier coefficient α and a peak voltage ratio ($V_p/V_{cc}$) in the first example (rated voltage 600V). The peak voltage ratio is a ratio ($V_p/V_{cc}$) of the maximum peak voltage $V_p$ of the collector-emitter voltage $V_{ce}$ to the power supply voltage $V_{cc}$. Also in the semiconductor devices with other rated voltages, the charge carrier coefficient α and the peak voltage ratio showed a relationship similar to that in the example of FIG. 11.

In a range of 2000<=α<=50000, the peak voltage ratio is small, and the voltage overshoot can be suppressed. Furthermore, the peak voltage ratio is substantially uniform with respect to the value of α on the horizontal axis. The charge carrier coefficient α may be 2000 or more and 50000 or less. That is, each parameter may be set such that the following term indicating the lower limit of α in Expression (1) is 2000 or more.

$$\frac{v_{sat}}{J_{rate}}\left(\frac{2\varepsilon_0\varepsilon_r V_B}{(x_i-x_j)^2}-N_D q\right)$$

In addition, each parameter may be set such that the following term indicating the upper limit of α in Expression (1) is 50000 or less.

$$\frac{v_{sat}}{J_{rate}}\left(\frac{2\varepsilon_0\varepsilon_r V_B}{(x_{i+1}-x_j)^2}-N_D q\right)$$

The charge carrier coefficient α may be 3000 or more, or 5000 or more. The charge carrier coefficient α may be 30000 or less, or 20000 or less.

Figure 12:
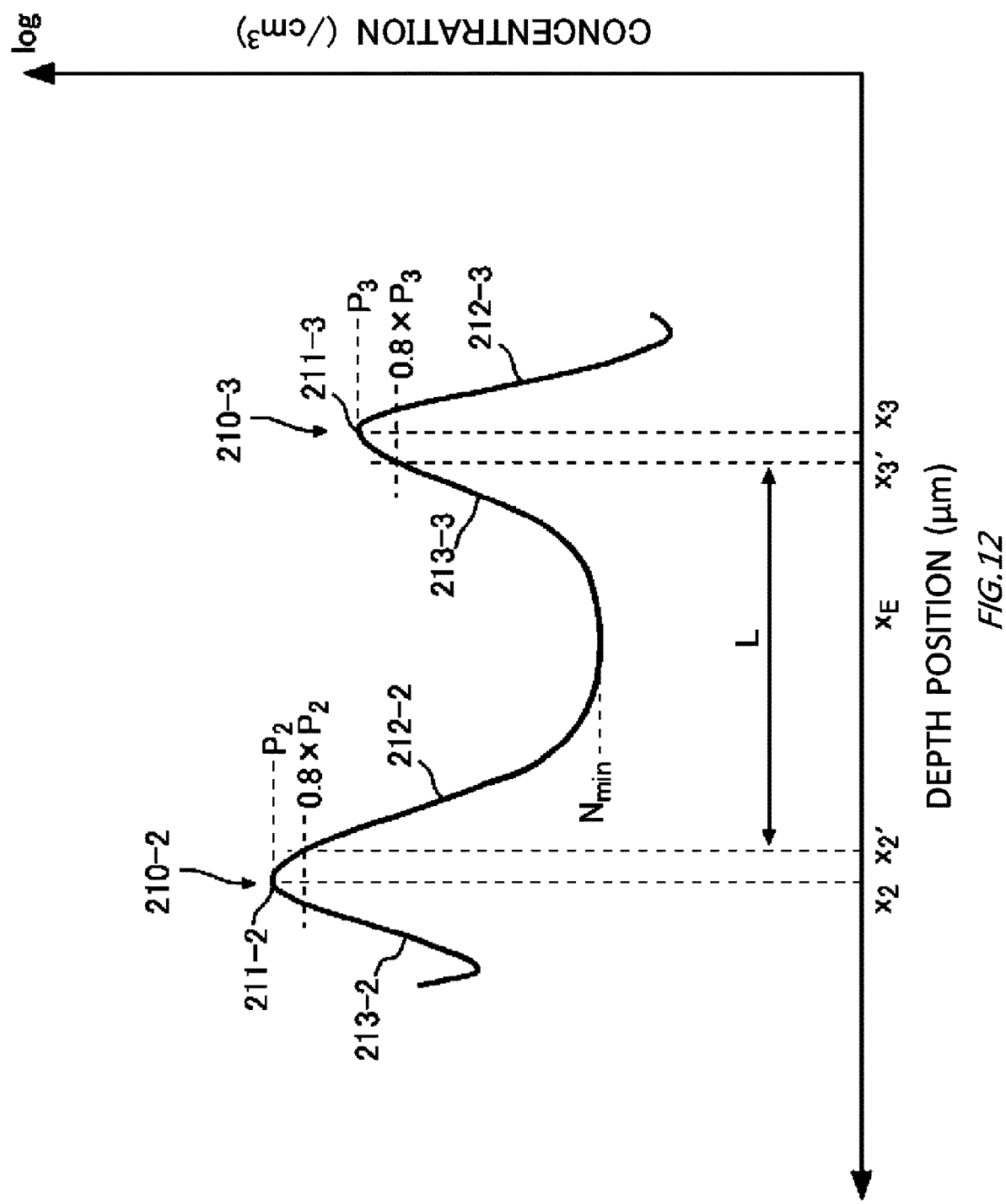
FIG. 12 illustrates a doping concentration peak 210-$i$ and a doping concentration peak 210-$i$+1 arranged with a lower end position xE of a space charge region interposed therebetween.

FIG. 12 illustrates the doping concentration peak 210-i and the doping concentration peak 210-i+1 arranged with the lower end position $x_E$ of the space charge region interposed therebetween. In this example, i=2.

In the present specification, when the peak-to-peak distance is referred to, as described above, a distance between two local maximums 211 may be used. In the upper tail 212-i of the doping concentration peak 210-i on the lower surface 23 side, a depth position at which the doping concentration becomes 80% of the peak concentration $P_2$ is defined as $x_2'$. In the lower tail 213-i+1 of the doping concentration peak 210-i+1 on the upper surface 21 side, a depth position at which the doping concentration becomes 80% of the peak concentration $P_3$ is defined as $x_3'$. A distance $x_2'-x_3'$ may be used as a peak-to-peak distance L.

The peak concentrations $P_2$ and $P_3$ may be decided from the net doping concentration, or may be decided from the donor concentration obtained by subtracting the bulk doping concentration from the net doping concentration. In addition, the positions at which the doping concentration become 80% concentrations of the peak concentrations $P_2$ and $P_3$ may be decided from the net doping concentration distribution, or may be decided from the donor concentration distribution obtained by subtracting the bulk doping concentration distribution from the net doping concentration distribution. The lower end position $x_E$ of the space charge region may be arranged in a region from the depth position $x_2'$ to the depth position $x_3'$.

The minimum value $N_{min}$ of the doping concentration between the doping concentration peak 210-i and the doping concentration peak 210-i+1 may be 10 times or less the doping concentration $N_{DR}$ of the drift region 18. As a result, the doping concentration in the vicinity of the lower end position $x_E$ of the space charge region can be lowered to suppress the voltage overshoot. The minimum value $N_{min}$ may be 5 times or less, or 3 times or less, the doping concentration $N_{DR}$ of the drift region.

The lower end position $x_E$ of the space charge region may be calculated by simulation using the structure of the semiconductor device 100 and the doping concentration of each region. In this case, when the semiconductor device 100 is turned off in a state where the power supply voltage $V_{cc}$ is applied to the semiconductor device 100 and the collector-emitter current $I_{ce}$ is flowing, the position of the lower end of the space charge region at a predetermined time point may be defined as $x_E$. The power supply voltage $V_{cc}$ may be 0.5 times or more and 0.8 times or less, for example, 0.7 times the rated voltage. The collector-emitter current $I_{ce}$ may be a current corresponding to a current density of 0.5 times or more and 3 times or less, for example, 2 times the rated current. The predetermined time point is a time point from time $t_1$ when the collector-emitter voltage $V_{ce}$ matches the power supply voltage $V_{cc}$ to time $t_3$ when the collector-emitter voltage $V_{ce}$ reaches the maximum value $V_p$, and is, for example, time $t_2$. The simulation may be performed by a known device simulator or a simulator obtained by combining a device simulator and a circuit simulator. The device simulator may be a simulator that solves the Poisson's equation (divE=p) of the electric field E and the space charge density p and the current continuity equation ($\partial n/\partial t = (1/q) \text{div} J_n + G_n - U_n$, $\partial p/\partial t = -(1/q) \text{div} J_p + G_p - U_p$, n is an electron density, p is a hole density, $J_{n,p}$ is an electron current density or a hole current density, $G_{n,p}$ is the generation ratio of electrons or holes, and $U_{n,p}$ is the recombination ratio of electrons or holes) on the basis of a predetermined device structure, boundary conditions, initial conditions, and the like. The circuit simulator may be a simulator that solves a steady-state solution and a transient solution under conditions such as a predetermined circuit pattern and a circuit constant in conjunction with the device simulator by using the solution of the device simulator.

While the embodiments of the present invention have been described, the technical scope of the present invention is not limited to the above-described embodiments. It is apparent to persons skilled in the art that various alterations or improvements can be made to the above-described embodiments. It is also apparent from the scope of the claims that the embodiments added with such alterations or improvements can be included in the technical scope of the present invention.

Note that the operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
   a semiconductor substrate having an upper surface and a lower surface and provided with a drift region of a first conductivity type; and
   a buffer region provided between the drift region and the lower surface and having a higher doping concentration than the drift region, wherein
   the buffer region has M doping concentration peaks provided at different positions in a depth direction of the semiconductor substrate, and
   a charge carrier coefficient α represented by Expression (1) is 2000 or more and 50000 or less in any one integer i (i is an integer of 1 or more and M−1 or less)

$$\frac{v_{sat}}{J_{rate}}\left(\frac{2\varepsilon_0 \varepsilon_r V_B}{(x_i - x_j)^2} - N_D q\right) \leq \alpha \leq \frac{v_{sat}}{J_{rate}}\left(\frac{2\varepsilon_0 \varepsilon_r V_B}{(x_{i+1} - x_j)^2} - N_D q\right) \quad (1)$$

where
$v_{sat}$ is a saturation velocity (cm/s) of charge carriers,
$J_{rate}$ is a rated current density (A/cm²) of a semiconductor device, $V_B$ is an avalanche breakdown voltage (V) of the semiconductor substrate, $x_i$ is a depth position (cm), from the upper surface, of an i-th doping concentration peak when counted from the lower surface among the doping concentration peaks in the buffer region, $x_{i+1}$ is a depth position (cm), from the upper surface, of an (i+1)-th doping concentration peak when counted from the lower surface among the doping concentration peaks in the buffer region, $x_j$ is a depth position (cm), from the upper surface, of a PN junction arranged closer to the upper surface than the buffer region and closest to the buffer region in the depth direction, $N_{DR}$ is a doping concentration (/cm³) of the drift region, $\varepsilon_0$ is a dielectric constant of vacuum and is $8.85418 \times 10^{-14}$ (F/cm), $\varepsilon_r$ is a relative dielectric constant of the semiconductor substrate, q is an elementary charge and is $1.60218 \times 10^{-19}$ (C), and M is an integer of 2 or more and 100 or less.

2. The semiconductor device according to claim 1, wherein
   the charge carrier coefficient α is 5000 or more in the integer i.

3. The semiconductor device according to claim 2, wherein
   the charge carrier coefficient α is 20000 or less in the integer i.

4. The semiconductor device according to claim 2, wherein
   the buffer region has three or more of the doping concentration peaks, and
   a peak-to-peak distance between the i-th doping concentration peak and the (i+1)-th doping concentration peak is larger than a peak-to-peak distance between the (i+1)-th doping concentration peak and an (i+2)-th doping concentration peak when counted from the lower surface.

5. The semiconductor device according to claim 2, wherein
   a peak-to-peak distance between the i-th doping concentration peak and the (i+1)-th doping concentration peak when counted from the lower surface is larger than a peak-to-peak distance between any other doping concentration peaks of the doping concentration peaks.

6. The semiconductor device according to claim 2, wherein
   a peak-to-peak distance between the i-th doping concentration peak and the (i+1)-th doping concentration peak when counted from the lower surface is 8 µm or more.

7. The semiconductor device according to claim 1, wherein
   the charge carrier coefficient α is 20000 or less in the integer i.

8. The semiconductor device according to claim 7, wherein
   the buffer region has three or more of the doping concentration peaks, and
   a peak-to-peak distance between the i-th doping concentration peak and the (i+1)-th doping concentration peak is larger than a peak-to-peak distance between the (i+1)-th doping concentration peak and an (i+2)-th doping concentration peak when counted from the lower surface.

9. The semiconductor device according to claim 7, wherein a peak-to-peak distance between the i-th doping concentration peak and the (i+1)-th doping concentration peak when counted from the lower surface is larger than a peak-to-peak distance between any other doping concentration peaks of the doping concentration peaks.

10. The semiconductor device according to claim 1, wherein
the buffer region has three or more of the doping concentration peaks, and
a peak-to-peak distance between the i-th doping concentration peak and the (i+1)-th doping concentration peak is larger than a peak-to-peak distance between the (i+1)-th doping concentration peak and an (i+2)-th doping concentration peak when counted from the lower surface.

11. The semiconductor device according to claim 10, wherein
the peak-to-peak distance between the i-th doping concentration peak and the (i+1)-th doping concentration peak is twice or more the peak-to-peak distance between the (i+1)-th doping concentration peak and the (i+2)-th doping concentration peak when counted from the lower surface.

12. The semiconductor device according to claim 11, wherein
a peak-to-peak distance between the i-th doping concentration peak and the (i+1)-th doping concentration peak when counted from the lower surface is larger than a peak-to-peak distance between any other doping concentration peaks of the doping concentration peaks.

13. The semiconductor device according to claim 10, wherein
a peak-to-peak distance between the i-th doping concentration peak and the (i+1)-th doping concentration peak when counted from the lower surface is larger than a peak-to-peak distance between any other doping concentration peaks of the doping concentration peaks.

14. The semiconductor device according to claim 1, wherein
a peak-to-peak distance between the i-th doping concentration peak and the (i+1)-th doping concentration peak when counted from the lower surface is larger than a peak-to-peak distance between any other doping concentration peaks of the doping concentration peaks.

15. The semiconductor device according to claim 1, wherein
a peak-to-peak distance between the i-th doping concentration peak and the (i+1)-th doping concentration peak when counted from the lower surface is 8 μm or more.

16. The semiconductor device according to claim 1, wherein
a minimum value of the doping concentration between the i-th doping concentration peak and the (i+1)-th doping concentration peak when counted from the lower surface is 10 times or less the doping concentration of the drift region.

17. The semiconductor device according to claim 1, wherein
the buffer region has three or more of the doping concentration peaks, and
i=2 in Expression (1).

18. The semiconductor device according to claim 1, wherein
each of the doping concentration peaks has a local maximum at which the doping concentration exhibits a maximum value, and
when the semiconductor device is turned off in a state where a voltage, which is 0.7 times a rated voltage of the semiconductor device, is applied as a power supply voltage and twice a rated current flows as a collector-emitter current, a position of a lower end of a space charge region at a time when a collector-emitter voltage matches the power supply voltage is arranged between the local maximum of the i-th doping concentration peak and the local maximum of the (i+1)-th doping concentration peak when counted from the lower surface.

19. The semiconductor device according to claim 18, wherein
each of the doping concentration peaks has a lower tail in which the doping concentration monotonically decreases from the local maximum toward the lower surface and an upper tail in which the doping concentration monotonically decreases from the local maximum toward the upper surface, and
the position of the lower end of the space charge region is arranged in a region not overlapping with the upper tail of the i-th doping concentration peak.

20. The semiconductor device according to claim 18, wherein
the doping concentration exhibits a local minimum value between the i-th doping concentration peak and the (i+1)-th doping concentration peak,
the buffer region has a flat portion, in which the doping concentration is twice or less the local minimum value, between the i-th doping concentration peak and the (i+1)-th doping concentration peak, and
the position of the lower end of the space charge region is arranged in the flat portion.

* * * * *